US012719523B2

(12) United States Patent
Raslan et al.

(10) Patent No.: US 12,719,523 B2
(45) **Date of Patent: *Aug. 25, 2026**

(54) NEURAL VOLTERRA DIGITAL COMPENSATOR WITH ENVELOPE NEURAL NETWORK

(71) Applicant: Analog Devices International Unlimited Company, County Limerick (IE)

(72) Inventors: Ahmed Mohamed Ragaei Abdelhamid Raslan, Ottawa (CA); Kevin Chuang, Belmont, MA (US)

(73) Assignee: Analog Devices International Unlimited Company, County Limerick (IE)

(*) Notice: Subject to any disclaimer, the term of this patent is extended or adjusted under 35 U.S.C. 154(b) by 0 days.

This patent is subject to a terminal disclaimer.

(21) Appl. No.: 18/747,230

(22) Filed: Jun. 18, 2024

(65) Prior Publication Data

US 2025/0385706 A1 Dec. 18, 2025

(51) Int. Cl.
*H04B 1/40* (2015.01)
*H03F 1/32* (2006.01)
*H04B 1/04* (2006.01)

(52) U.S. Cl.
CPC ................ *H04B 1/40* (2013.01); *H03F 1/32* (2013.01); *H03F 1/3241* (2013.01); *H03F 1/3294* (2013.01); *H04B 1/0475* (2013.01); *H04B 2001/0425* (2013.01)

(58) Field of Classification Search
CPC ........ H03F 1/32; H03F 1/3241; H03F 1/3247; H03F 1/3294; H03F 2201/3233; H04B 1/0475; H04B 1/38; H04B 1/40; H04L 27/367; H04L 27/368
USPC ....... 375/219, 254, 279, 281, 285, 296, 297; 381/94.1; 455/67.13, 114.3
See application file for complete search history.

(56) References Cited

U.S. PATENT DOCUMENTS

| | | | |
|---|---|---|---|
| 5,335,312 | A | 8/1994 | Mekata et al. |
| 6,594,382 | B1 | 7/2003 | Woodall |
| 10,523,159 | B2 | 12/2019 | Megretski et al. |
| 10,693,509 | B1 | 6/2020 | Summerfield |
| 10,700,914 | B1 | 6/2020 | Summerfield |
| 10,892,786 | B1 | 1/2021 | Pratt et al. |
| 11,133,854 | B1 | 9/2021 | Pratt et al. |
| 11,303,251 | B2 | 4/2022 | Wu et al. |
| 11,671,130 | B2 | 6/2023 | Summerfield et al. |
| 12,003,261 | B2 | 6/2024 | Yu et al. |
| 12,028,188 | B2 | 7/2024 | Yu et al. |

(Continued)

OTHER PUBLICATIONS

Garcia-Hernandez, et al., "Digital predistorter based on Volterra series for nonlinear power amplifier applied to OFDM systems using adaptive algorithms," Procedia Engineering, 2012, 35: 118-125.

(Continued)

*Primary Examiner* — Young T. Tse
(74) *Attorney, Agent, or Firm* — Knobbe, Martens, Olson & Bear, LLP

(57) ABSTRACT

Aspects of this disclosure relate to digital compensators, such as digital predistortion systems. Digital predistortion systems disclosed herein use a neural Volterra approach. Such digital predistortion systems can include a first processing path, an envelope processing path comprising an envelope artificial neural network, multipliers configured to multiply respective output signals of the first processing path and the envelope processing path, and a combiner configured to generate a combined output signal based on at least output signals of the multipliers. The combined output signal is a digitally predistorted version of the input signal.

20 Claims, 12 Drawing Sheets

(56) References Cited

U.S. PATENT DOCUMENTS

| | | | | |
|---|---|---|---|---|
| 12,040,753 | B2 | 7/2024 | Yu et al. | |
| 12,068,768 | B2 | 8/2024 | Summerfield et al. | |
| 12,452,119 | B2 | 10/2025 | Tanzil | |
| 2005/0157814 | A1 | 7/2005 | Cova et al. | |
| 2018/0375480 | A1* | 12/2018 | Rollins | H03F 1/3252 |
| 2020/0274560 | A1* | 8/2020 | Pratt | H04L 25/03343 |
| 2022/0036176 | A1 | 2/2022 | Megretski et al. | |
| 2022/0368571 | A1 | 11/2022 | Yu et al. | |
| 2022/0376659 | A1 | 11/2022 | Yu et al. | |
| 2023/0016637 | A1 | 1/2023 | Schmidt et al. | |
| 2023/0033203 | A1 | 2/2023 | Liu et al. | |
| 2023/0268942 | A1* | 8/2023 | Ghannouchi | H04B 1/0475 375/297 |
| 2024/0119264 | A1 | 4/2024 | Vu et al. | |
| 2024/0204809 | A1 | 6/2024 | Masood et al. | |
| 2024/0305322 | A1 | 9/2024 | Chuang et al. | |
| 2024/0429955 | A1* | 12/2024 | Hoversten | H04B 1/0475 |

OTHER PUBLICATIONS

Masterson, C., "Digital Predistortion for RF Communications: From Equations to Implementation," Analog Dialogue, vol. 56, No. 2, Apr. 2022, in 5 pages.

Muškatirović-Zekić et al., "Efficient Neural Network DPD Architecture for Hybrid Beamforming mMIMO." Electronics, 2023, 12(3): 1-13.

Tarver et al., "Design and Implementation of a Neural Network Based Predistorter for Enhanced Mobile Broadband," 2019 IEEE International Workshop on Signal Processing Systems (SiPS), 2019, in 6 pages.

Tarver et al., "Neural Network DPD via Backpropagation through a Neural Network Model of the PA," 2019 53rd Asilomar Conference on Signals, Systems, and Computers, IEEE, 2019, pp. 358-362.

Wu, et al., "Residual Neural Networks for Digital Predistortion," GLOBECOM 2020-2020 IEEE Global Communications Conference, 2020, in 6 pages.

Cioba et al., "Efficient Attention Guided 5G Power Amplifier Digital Predistortion," arXiv, Mar. 30, 2020, in 5 pages.

Extended European Search Report issued in European Patent Application No. 25168733.1, dated Sep. 30, 2025.

Fischer-Buhner et al., "Phase-Normalized Neural Network for Linearization of RF Power Amplifiers," IEEE Microwave and Wireless Technology Letters, Sep. 2023, 33(9): 1357-1360.

Tanio et al., "Efficient Digital Predistortion Using Sparse Neural Network," IEEE Access, Jun. 2020, 8: 117841-117852.

Yu et al., "Self-Sensing Digital Predistortion of RF Power Amplifiers for 6G Intelligent Radio," IEEE Microwave and Wireless Components Letters, May 2022, 32(5): 475-478.

* cited by examiner 300
302
104
102
Feature Preprocessing
Feature NN
Envelope NN
202
206
Signal Partitioning
224
LUT 1
LUT 2
LUT N
118
108
110
x[n]
y[n]

400
302
Feature Preprocessing
102
Feature NN
202
Envelope NN
212
Feature Preprocessing
424
Signal Partitioning
118A
LUT 1
LUT 2
LUT N
118B
LUT 1
LUT 2
LUT M
108A
108B
110
$x[n]$
$y[n]$

NEURAL VOLTERRA DIGITAL COMPENSATOR WITH ENVELOPE NEURAL NETWORK

CROSS REFERENCE TO RELATED APPLICATION

The present disclosure relates to U.S. application Ser. No. 18/747,221, filed on even date herewith, and titled "NEURAL VOLTERRA DIGITAL COMPENSATOR WITH FEATURE NEURAL NETWORK," the disclosure of which is hereby incorporated by reference in its entirety and for all purposes.

BACKGROUND

Technical Field

The present disclosure generally relates to digital compensation. Aspects of this disclosure can be implemented in digital predistortion (DPD) circuitry in a transceiver.

Description of Related Technology

Transceivers may be used by wireless devices to transmit and/or receive radio frequency signals. Components of a transceiver, such as a radio frequency power amplifier, can have non-linearities. Digital predistortion (DPD) is a technique that can distort a digital signal in an input signal chain for a non-linear component to compensate for a non-linearity. DPD can be implemented in high performance transceivers. As wireless system specifications become more demanding, higher performance and/or more efficient DPD is desired.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a digital predistortion system that includes a feature processing path, an envelope processing path, multipliers, and a combiner. The feature processing path is configured to transform an input signal in a complex valued domain. The feature processing path includes a feature artificial neural network. The envelope processing path is configured to derive an envelope of the input signal and apply a non-linear gain function. The multipliers are configured to multiply respective output signals of the feature processing path and the envelope processing path. The combiner is configured to generate a combined output signal based on at least output signals of the multipliers and output the combined output signal. The combined output signal is a digitally predistorted version of the input signal.

The feature processing path can include a feature preprocessing block configured to transform the input signal from a complex signal to a real signal. The feature preprocessing block can have an output coupled to an input of the feature artificial neural network.

The feature artificial neural network can receive at least one of a sensor input signal or an external input signal.

The envelope processing path can include an envelope artificial neural network.

The envelope processing path can include an envelope processing block configured to derive the envelope of the input signal and a gain block coupled to an output of the envelope processing block. The gain block can include a plurality of non-linear gain blocks configured to apply non-linear transformations to implement the non-linear gain function. The envelope processing path can include additional combiners connected to outputs of the gain block, in which the additional combiners are connected to respective inputs of the multipliers. The envelope processing path can include a signal partitioning block configured to delay and partition the input signal, in which the signal partitioning block has an output connected to an input of the envelope processing block. The envelope processing path can include a signal partitioning block configured to delay and partition a signal provided by the envelope processing block, in which the signal partitioning block is coupled between the envelope processing block and the gain block. The non-linear gain blocks can include look up tables.

The digital predistortion system can include Volterra processing blocks. The Volterra processing block can include non-linear processing blocks, non linear gain blocks having inputs connected to outputs of the non-linear processing blocks, a set of combiners each configured to combine output signals of a group of non-linear grain blocks of the non-linear gain block, and a second set of multipliers coupled to the set of combiners. The combiner can combine output signals from the second set of multipliers with the output signals from the multipliers to generate the combined output signal.

The digital predistortion system can be included on a transceiver integrated circuit.

The input signal can be a digital baseband signal that comprises a data stream of in-phase and quadrature samples, and wherein the digital predistortion system is configured to perform sample rate digital predistortion.

Another aspect of this disclosure is a method of digital predistortion. The method includes: transforming a digital input signal in a complex-valued domain using at least a feature artificial neural network; generating an envelope signal by at least deriving an envelope of the digital input signal; applying a non-linear gain function to the envelope signal; multiplying signals generated by the transforming with signals generated by the applying; and generating a combined output signal based on at least output signals generated by the multiplying, wherein the combined output signal is a digitally predistorted version of the digital input signal.

Generating the envelope signal further comprises applying a delay and partitioning the digital input signal before the deriving the envelope.

Generating the envelope signal can include applying a delay and portioning the digital input signal after the deriving the envelope. Deriving the envelope can use an envelope artificial neural network.

The feature artificial neural network can receive a sensor input signal from a sensor.

The method can include performing Volterra processing on the digital input signal, in which combining includes combining output signals of the Volterra processing with the output signal generated by the multipliers.

Another aspect of this disclosure is a wireless communication system comprising that includes a transceiver integrated circuit and a power amplifier in communication with the transceiver integrated circuit. The transceiver integrated circuit includes a digital predistortion system. The digital predistortion system includes: a feature processing path configured to transform an input signal in a complex valued domain, the feature processing path comprising a feature artificial neural network; multipliers configured to multiply output signals of the feature processing path and with output signals from another processing path; and a combiner configured to generate a combined output signal based on at least output signals of the multipliers and output the combined output signal, the combined output signal being a digitally predistorted version of the input signal. The digital predistortion system is configured to reduce non-linearity of the power amplifier.

The transceiver integrated circuit can include a sensor having an output connected to an input of the feature artificial neural network.

A digital predistortion actuator can include the feature processing path, the multipliers, and the combiner. The transceiver integrated circuit can include a digital predistortion adaptation circuit in communication with the digital predistortion actuator.

Another aspect of this disclosure is a digital predistortion system that includes a first processing path configured to process an input signal, an envelope processing, multipliers configured to multiply respective output signals of the first processing path and the envelope processing path, and combiner configured to generate a combined output signal based on at least output signals of the multipliers and output the combined output signal. The envelope processing path is configured to derive an envelope of the input signal and apply a non-linear gain function. The envelope processing path includes an envelope artificial neural network. The combined output signal is a digitally predistorted version of the input signal.

The envelope processing path can include a feature preprocessing block configured to transform the input signal from a complex signal to a real signal. The feature preprocessing block can have an output coupled to an input of the envelope artificial neural network.

The envelope processing path can include a signal partitioning block configured to delay and partition a signal provided by the envelope artificial neural network; and a gain block comprising a plurality of non-linear gain blocks configured to apply non-linear transformations to implement the non-linear gain function, in which the gain block is coupled between the signal partitioning block and the multipliers. The non-linear gain blocks can include look up tables. The digital predistortion system can include a set of combiners coupled between the non-linear gain blocks and the multipliers, in which each combiner of the set of combiners configured to combine outputs of a group of non-linear gain blocks of the plurality of non-linear gain blocks. The digital predistortion system can include a second set of multipliers; and a second set of non-linear gain blocks coupled between the signal partitioning block and the second set of multipliers, in which the combiner is configured to combine at least output signals from the multipliers and output signals from the second set of multipliers to generate the combined signal.

The envelope artificial neural network can receive at least one of a sensor input signal or an external input signal.

The first processing path can include a feature preprocessing block configured to perform a complex-to-complex transformation. The feature preprocessing block can perform complex multiplications.

The first processing path can include a feature artificial neural network.

The digital predistortion system can include Volterra processing blocks. The Volterra processing blocks can include non-linear processing blocks, non linear gain blocks having inputs connected to outputs of the non-linear processing blocks, a set of combiners each configured to combine output signals of at least two of the non linear gain blocks, and a second set of multipliers coupled to the set of combiners. The combiner can be configured to combine output signals from the second set of multipliers with the output signals from the multipliers to generate the combined signal.

A transceiver integrated circuit can include the digital predistortion system.

The input signal can be a digital baseband signal that includes a data stream of in-phase and quadrature samples. The digital predistortion system can perform sample rate digital predistortion.

Another aspect of this disclosure is a method of digital predistortion. The method includes: transforming a digital input signal in a complex-valued domain; generating an envelope signal from the digital input signal using at least an envelope artificial neural network; applying non-linear gain function to the envelope signal; multiplying signals generated by the transforming with signals generated by the applying; and generating a combined output signal based on at least output signals generated by the multiplying, wherein the combined output signal is a digitally predistorted version of the digital input signal.

Generating the envelope signal can include: transforming the input signal from a complex signal to a real signal, the envelope artificial neural network configured to receive the real signal; and delaying and partitioning a signal provided by the envelope artificial neural network.

The artificial neural network can receive a sensor input signal from a sensor.

The method can include performing Volterra processing on the input signal, in which the combining includes combining output signals of the Volterra processing with the output signals generated by the multipliers.

Another aspect of this disclosure is a wireless communication system that includes a transceiver integrated circuit and a power amplifier in communication with the transceiver integrated circuit. The transceiver integrated circuit includes comprising a digital predistortion system. The digital predistortion system includes an envelope processing path configured to derive an envelope of an input signal and apply a non-linear gain function, the envelope processing path comprising an envelope artificial neural network; multipliers configured to multiply output signals of the envelope processing path and output signals of another processing path; and a combiner configured to generate a combined output signal based on at least output signals of the multipliers and output the combined output signal, the combined output signal being a digitally predistorted version of the input signal. The digital predistortion system is configured to reduce non-linearity of the power amplifier.

The transceiver integrated circuit can include a sensor having an output connected to an input of the envelope artificial neural network.

A digital predistortion actuator can include the envelope processing path, the multipliers, and the combiner. The transceiver integrated circuit can include a digital predistortion adaptation circuit in communication with the digital predistortion actuator.

For purposes of summarizing the disclosure, certain aspects, advantages, and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will be described, by way of non-limiting example, with reference to the accompanying drawings.

DETAILED DESCRIPTION OF CERTAIN EMBODIMENTS

Figure 1A:
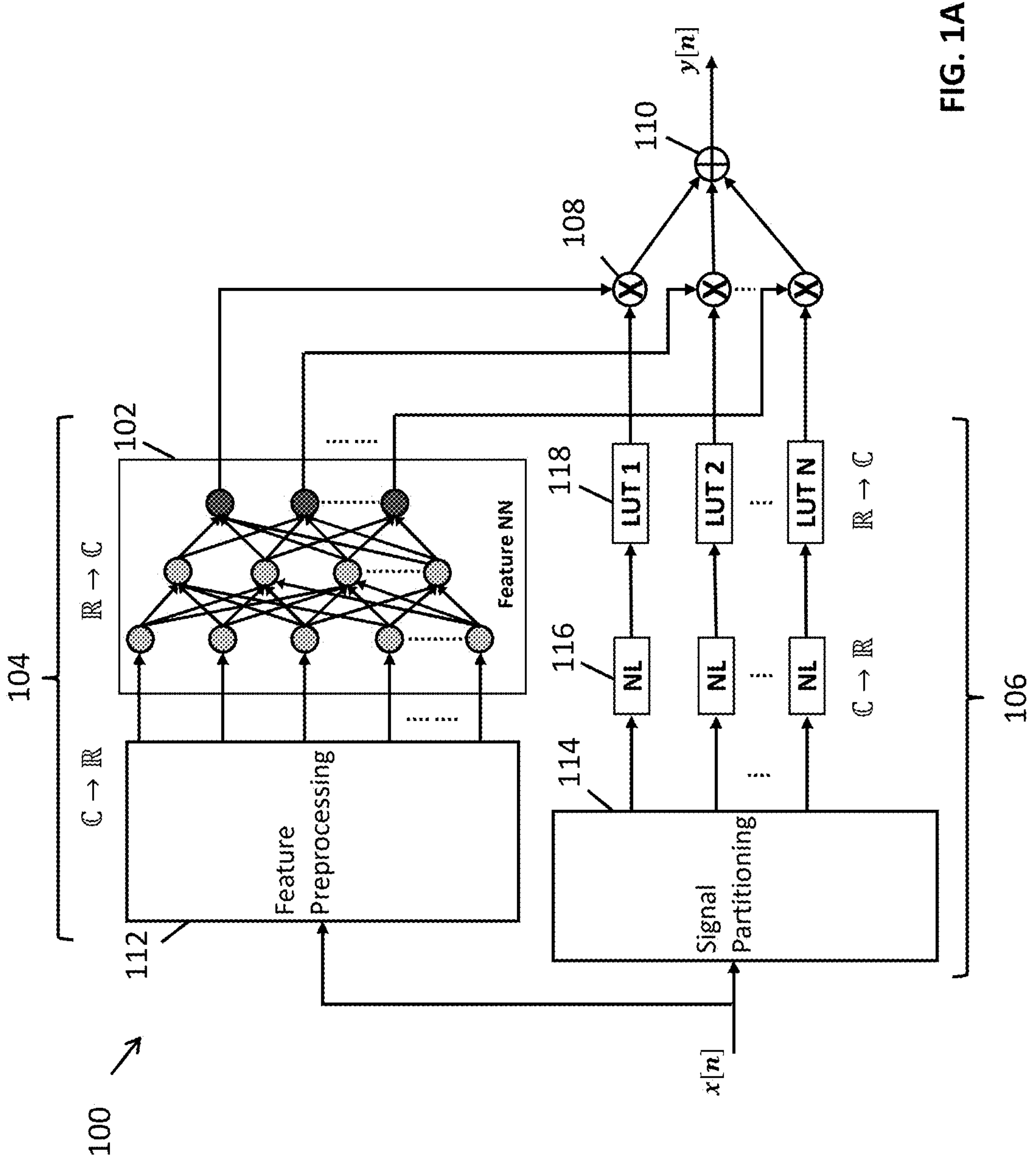
FIG. 1A is a schematic block diagram of a digital predistortion (DPD) system that includes a feature neural network (feature NN) according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the illustrated elements. Further, some embodiments can incorporate any suitable combination of features from two or more drawings. The headings provided herein are for convenience only and do not necessarily affect the scope or meaning of the claims.

Aspects of this disclosure relate to new non-linear digital compensators. Architectures disclosed herein utilize the power of artificial neural networks to design new features in Volterra-based models. Measurement results show increased performance of digital compensators disclosed herein in linearizing non-linear systems compared to existing digital compensators.

High-performance system-on-chip (SoC) transceiver-based wireless solutions can include digital predistortion (DPD). DPD can elevate the radio frequency performance (e.g., bandwidth and emission) of the radio system. Certain DPD solutions operating at an in-phase/quadrature (IQ) sample rate are based on the complex baseband Volterra series. Multistage Volterra based models have shown high performance for linearizing single-input single-output (SISO) power amplifiers in harsh test conditions. Volterra based models have a complexity of optimizing coefficients that scales quadratically with respect to the number of features. Thus, power consumption and implementation area can be highly dependent on model choice. Other DPD solutions relate to artificial neural networks. Artificial neural network models with pruning techniques have shown desirable results to compensate for non-linearities for wide bandwidth multiple-input signal-output (MISO) power amplifiers, such as load modulated balanced amplifiers (LMBAs).

The existing DPD approaches of using either Volterra based models or artificial neural networks tend to be either cursed with dimensionality or impracticality. In contrast, this disclosure provides hybrid approaches to allow for extraction of efficient models to cope with ever-increasing levels of radio performance and technical specifications.

Complex baseband Volterra based models can be generalized as a finite composition of scalar products of linear and non-linear basis functions of a single variable. Equation 1 provides an example mathematical Volterra based formulation for complex digital baseband signals.

$$y[n] = \sum_{p:(l,i)}^{N_p} \zeta_l[x[n-\tau_l]] \cdot \sum_{q:(j,r,s)}^{N_q} \varphi_s[\theta_r[x[t-\tau_j]]] \qquad \text{(Equation 1)}$$

In Equation 1, x is a digital input and y is a digital output. $\zeta$ represents a transformation of the digital input signal x in a complex-valued domain. $\zeta$ represents a complex-to-complex transformation ($\mathbb{C} \rightarrow \mathbb{C}$) from the digital input signal x to higher order dynamics. Such higher order non-linear dynamics can be from a dynamic deviation reduction (DDR) model. $\theta$ represents a complex-to-real transformation ($\mathbb{C} \rightarrow \mathbb{R}$) where a non-linear envelope of x is derived and a linear time invariant (LTI) transformation is applied. $\varphi$ represents a real-to-complex transform ($\mathbb{R} \rightarrow \mathbb{C}$) that is non-linear to implement a gain function. $\varphi$ can be implemented using look up tables (LUTs).

Hybrid neural Volterra approaches of this disclosure can implement $\zeta$ and/or $\theta$ using an artificial neural network. An artificial neural network may also be referred to as a neural network in this disclosure. $\zeta$ can be implemented using a complex feature neural network. Alternatively or additionally, $\theta$ can be implemented by an envelope feature neural network. With a complex feature neural network and/or an envelope neural network, Equation 1 can be rewritten as Equation 2, 3, or 4.

$$y[n] = \sum_{p:(l,i)}^{N_p} FeatureNN_l[x[n-\tau_i]] \cdot \sum_{q:(j,r,s)}^{N_q} \varphi_s[\theta_r[x[t-\tau_j]]] \quad \text{(Equation 2)}$$

$$y[n] = \sum_{p:(l,i)}^{N_p} \zeta_l[x[n-\tau_i]] \cdot \sum_{q:(j,r,s)}^{N_q} \varphi_s[EnvelopeNN_r[x[t-\tau_j]]] \quad \text{(Equation 3)}$$

$$y[n] = \sum_{p:(l,i)}^{N_p} FeatureNN_l[x[n-\tau_i]] \cdot \sum_{q:(j,r,s)}^{N_q} \varphi_s[EnvelopeNN_r[x[t-\tau_j]]] \quad \text{(Equation 4)}$$

Neural networks of Equations 2, 3, and/or 4 can be optimized offline using backpropagation algorithms to find the best features and/or envelope processes for increasing and/or optimizing the DPD performance. Various loss functions can be used to focus the performance on specific regions on a spectrum and/or DPD metrics (e.g., adjacent channel leakage ratio (ACLR), spectrum emission mask (SEM), etc.). This can provide freedom to design the best features for a specific power amplifier and/or test-case. Since models are still linear in parameters, linear regression techniques can be used for online adaptation.

Digital compensators, such as DPD systems, can include a feature processing path, an envelope processing path, multipliers configured to multiply respective output signals of the feature processing path and the envelope processing path, and a combiner configured to combine output signals of the multipliers. The processing paths, multipliers, and combiner can be included in a DPD actuator. In certain embodiments, the feature processing path can include a feature artificial neural network. Such embodiments can correspond to Equation 2 or Equation 4. In certain embodiments, the envelope processing path can include an envelope artificial neural network. Such embodiments can correspond to Equation 3 or Equation 4. In some embodiments, the feature processing path can include a feature artificial neural network and the envelope processing path can include an envelope artificial neural network. Such embodiments can correspond to Equation 4.

Digital compensators disclosed herein can apply various mapping ratios to meet performance specifications. Alternatively or additionally, a sensor input can be provided to an artificial neural network to increase performance of the digital compensator based on the sensor input.

Example DPD systems will be described with reference to the figures. The illustrated components of the DPD systems of FIGS. 1A-4 and 7-10 can implement a DPD actuator. DPD systems disclosed herein provide a hybrid of Volterra based DPD and neural network based DPD. The DPD systems disclosed herein can implement sample rate DPD.

FIG. 1A is a schematic block diagram of a DPD system 100 that includes a feature neural network (feature NN) 102 according to an embodiment. The neural networks disclosed herein are artificial neural networks. The DPD system 100 is arranged to generate a pre-compensated digital output signal y[n] from a baseband digital input signal x[n] based on Equation 2. The input signal x[n] can be a data stream of IQ samples. The input signal x[n] can be a complex digital baseband signal having a real part (in-phase component) and an imaginary part (quadrature component).

As illustrated, the DPD system 100 includes a feature processing path 104, an envelope processing path 106, multipliers 108, and a combiner 110. Together the feature processing path 104 and the envelope processing path 106 implement feature engineering. The DPD system 100 can be implemented by any suitable circuitry, such as any suitable circuitry of a transceiver integrated circuit. For example, in some applications, the DPD system 100 and/or other DPD systems disclosed herein can be implemented by digital signal processor (DSP) logic, neural network compute logic, registers, and a controller. Each processing path, block, artificial neural network, LUT, multiplier, combiner, or the like of the DPD systems disclosed herein is implemented by circuitry, such as circuitry of a transceiver integrated circuit. Any suitable circuitry can implement blocks, artificial neural networks, LUTs, multipliers, combiners, or the like of the DPD systems disclosed herein in a digital domain.

The feature processing path 104 includes a feature preprocessing block 112 and the feature NN 102. The feature processing path 104 transforms the input signal x[n] in a complex-r-valued domain. Accordingly, the feature processing path 104 can be referred to as a complex feature processing path. The feature processing path 104 performs a complex-to-complex transformation on the input signal x[n]. This transformation can transform the input signal x[n] to non-linear dynamics, such as non-linear dynamics from DDR models. The complex-to-complex transformation involves a complex-to-real transformation by the feature preprocessing block 112 and a real-to-complex transformation by the feature NN 102.

The feature preprocessing block 112 generates input features for the feature NN 102 to enhance performance of the IQ samples of the input signal x[n] in the feature NN 102. The feature preprocessing block 112 can perform linear and/or non-linear operations. The input signal x[n] provided to the feature preprocessing block 112 has a real part and an imaginary part. The feature preprocessing block 112 can transform the input signal x[n] from a complex signal to a real signal. In certain applications, the feature preprocessing block 112 can take products of samples of the real part or imaginary part and provide a real output signal to the feature NN 102. Example operations that can be performed by the feature preprocessing block 112 include but are not limited to Re{x[n−i]}, Im{x[n−i]}, . . . . Re or Im{x[n−i]|x[n−j]|}, . . . . The feature preprocessing block 112 can be implemented in accordance with any suitable principles and advantages disclosed in U.S. patent application Ser. No. 18/361,697, filed Jul. 28, 2023, and titled "GENERALIZED DIGITAL COMPENSATOR FOR WIRELESS SYSTEMS," the disclosure of which is hereby incorporated by reference in its entirety and for all purposes. In certain embodiments, the feature preprocessing block 112 can include non-linear processing elements, multiplexers, an arithmetic processing unit (e.g., to perform one or more of the following functions: add, mean, difference, or multiplication block), and an output multiplexer/decoder.

In certain applications, non-linear features can be derived by multiplying different delayed versions of the input signal x[n] or the conjugates of these delayed versions. Such operations can capture relatively weak non-linearities. With the feature NN 102, harder (e.g., higher order) or different non-linearities can be captured relatively easily. The feature NN 102 can achieve the same transformation as some prior approaches with higher accuracy in the complex-valued domain. By extracting features in the complex-valued domain, frequency-selective behavior can be modeled directly within the feature NN 102. For instance, asymmetrical distortions in spectrum can be modeled by the feature NN 102.

The feature NN 102 can model any suitable features. Assuming there is an analog sensor input or another external input, for example as discussed with reference FIG. 10, the feature NN 102 can be used to parameterize the model with respect to different conditions. For example, in a time interleaving architecture, the rising edge and falling edge of the clock can be used to trigger the feature NN 102 to learn certain behaviors near the clock edge with respect to the input clock signal. Another example is that the external input can be a Time Division Duplex (TDD) trigger signal, in which, the rising edge of the TDD trigger signal can inform the feature NN 102 that the valid data is coming to the radio, and hence train the network to compensate for any non-ideal behavior happening during the transition of the TDD signal from data off to data on.

The feature NN 102 can receive a real signal from the feature preprocessing block 112. Two outputs of the feature NN 102 can form one complex number provided to a multiplier 108. Because the feature NN 102 provides complex output signals having a real part and an imaginary part, the feature NN 102 can be referred to as a complex feature NN.

The feature NN 102 can be trained offline to determine weights and biases of the feature NN 102. Such offline training can be performed in a factory before deployment of a system that includes the DPD system 100 and/or during foreground calibration before the system that includes the DPD system 100 is operational for RF communication. In some instances, the feature NN 102 can be trained during operation of a system that includes the DPD system 100. This can be referred to as in the field training or online training. The feature NN 102 can be trained using a relatively small amount of a waveform, such as less than 10% or 5% or less.

The feature NN 102 can include any suitable number of layers and any suitable number of neurons per layer. Layers of the feature NN 102 can be referred to as hidden layers. There can be at least two hidden layers in the feature NN 102. The number of neurons and the number of layers can be relatively small for a neural network. In the example illustrated in FIG. 1A, there are 3 layers shown in the feature NN 102. Different layers can have different numbers of neurons.

Neurons of the feature NN 102 can be connected any suitable way, such as but not limited to fully connected between layers or partly connected between layers. As illustrated in FIG. 1A, neurons of the feature NN 102 are fully connected between layers. The feature NN 102 can have any suitable neural network architecture, such as but not limited to a fully connected neural network (FCNN), a convolutional neural network (CNN), or long short-term memory neural network (LSTM NN).

The envelope processing path 106 includes a signal partitioning block 114, an envelope processing block that includes non-linear processing blocks 116, and a grain block that includes LUTs 118. The envelope processing path 106 can be referred to as an envelope feature processing path. The envelope processing path 106 can derive an envelope of the input signal x[n], apply a delay, and apply a gain function.

The signal partitioning block 114 can partition the input signal x[n] for processing by the non-linear processing blocks 116 of the envelope processing block. In certain embodiments, the non-linear processing blocks 116 can include non-linear processing elements, multiplexers, an arithmetic processing unit (e.g., to perform one or more of the following functions: add, mean, difference, or multiplication block), and an output multiplexer/decoder. The signal partitioning block 114 can apply a delay. The signal partitioning block 114 can include one or more delay lines and switching circuitry to time shift and partition the input signal x[n].

The envelope processing block can derive an envelope of the input signal x[n]. This can implement a complex to real transformation. The envelope processing block includes a plurality of non-linear processing blocks 116 that can each operate on a partitioned signal from the signal partitioning block 114. In certain applications, the non-linear processing blocks 116 can perform absolute value computations. The envelope processing block can output an envelope signal from the non-linear processing blocks 116. The envelope signal can have a plurality of components provided by induvial non-linear processing blocks 116.

The gain block can apply a gain function to the envelope signal. The gain block can include a plurality of non-linear gain blocks that each apply a non-linear gain on a partition of the envelope signal. In the DPD system 100, the gain block includes the LUTs 118. The LUTs 118 are examples of non-linear gain blocks. Each of the LUTs 118 can apply a non-linear grain to a partition of the envelope signal. The LUTs 118 can implement piecewise liner basis functions. For example, the LUTs 118 can implement a weighted sum of basis functions, including orthogonal polynomials, B-splines, or the like. The LUTs 118 can perform a real to complex transformation. The LUTs 118 and/or any other LUTs disclosed herein can be programmed during operation of a communication system that includes such LUTs. For example, the LUTs 118 can be programmed based on an observation receive signal provided to a transceiver integrated circuit. A DPD adaptation circuit can be used to program the LUTs 118.

The multipliers 108 and the combiner 110 can perform multiply sum operations. The multipliers 108 can multiply output signals of the feature processing path 104 with output signals from another processing path. As illustrated in FIG. 1A, the multipliers 108 can multiply respective output signals of the feature processing path 104 and the envelope processing path 106. The multipliers 108 can each perform a multiplication of two complex numbers, which can be referred to as a complex multiplication. Each multiplication of an output signal from the feature processing path 104 and an output signal from the envelope processing path 106 can be a basis function.

The combiner 110 can combine output signals of the multipliers 108. The combination can be a sum. The combiner 110 can be an adder, for example, that sums output signals of the multipliers 108. The combiner 110 can provide the output signal y[n] that is a digitally predistorted version of the input signal x[n].

Figure 1B:
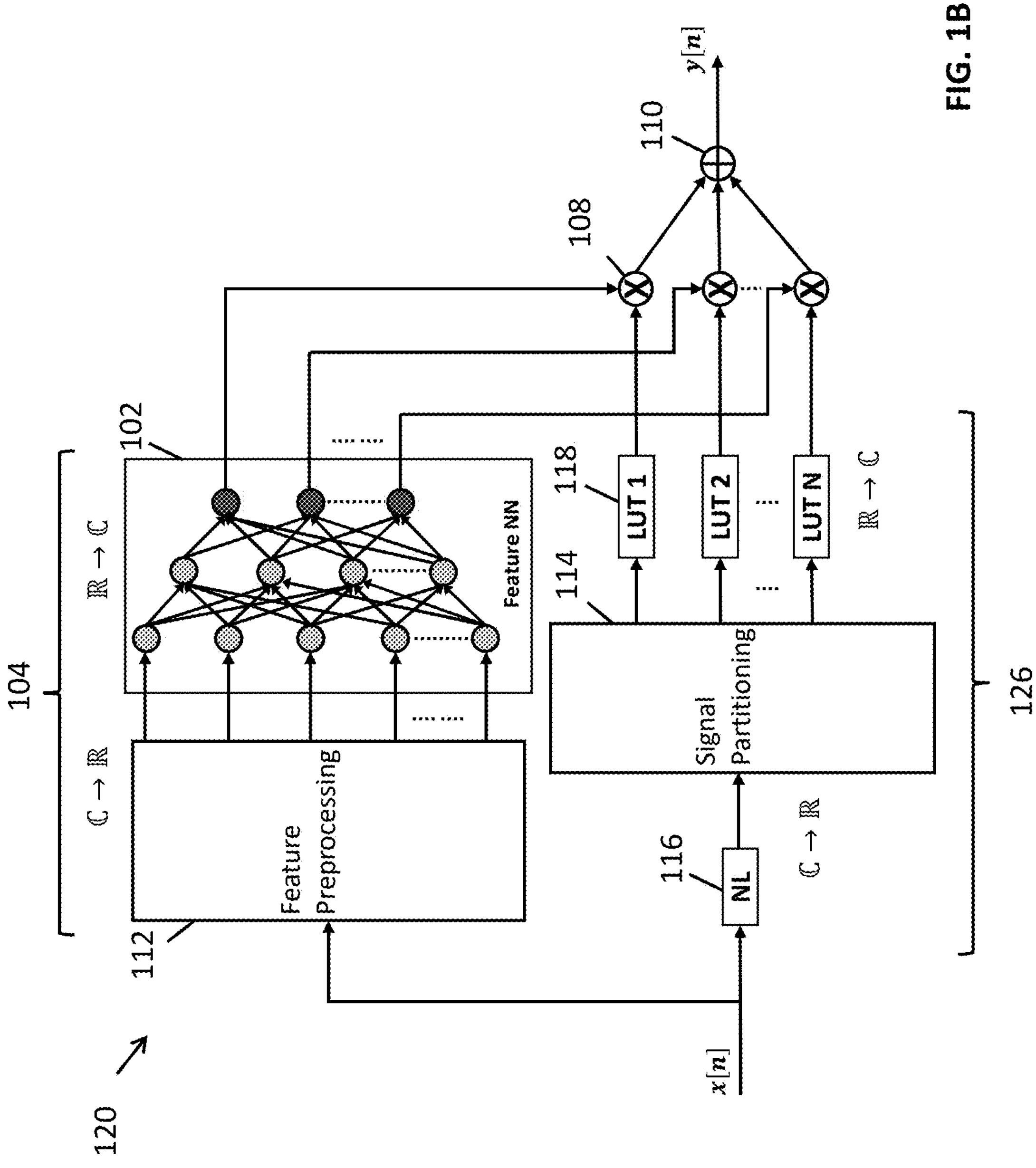
FIG. 1B is a schematic block diagram of a DPD system that includes a feature NN according to another embodiment.

FIG. 1B is a schematic block diagram of a DPD system 120 that includes a feature NN 102 according to an embodiment. The DPD system 120 is like the DPD system 100 of FIG. 1A, except that the envelope processing paths are different. In the DPD system 120, an envelope processing path 126 derives an envelope of the input signal x[n] and then applies a delay and partition. In the envelope processing path 126, the envelope processing block includes a single non-linear processing block 116 to derive an envelope of the input signal x[n]. The output of the non-linear processing block 116 can be delayed and partitioned by the signal partitioning block 114 in the envelope processing path 126. The envelope processing path 126 can apply a gain function to the envelope signal provided by the signal partitioning block 114 using the LUTs 118. The DPD system 120 can be implemented in less physical area than the DPD system 100 of FIG. 1A.

Figure 2:
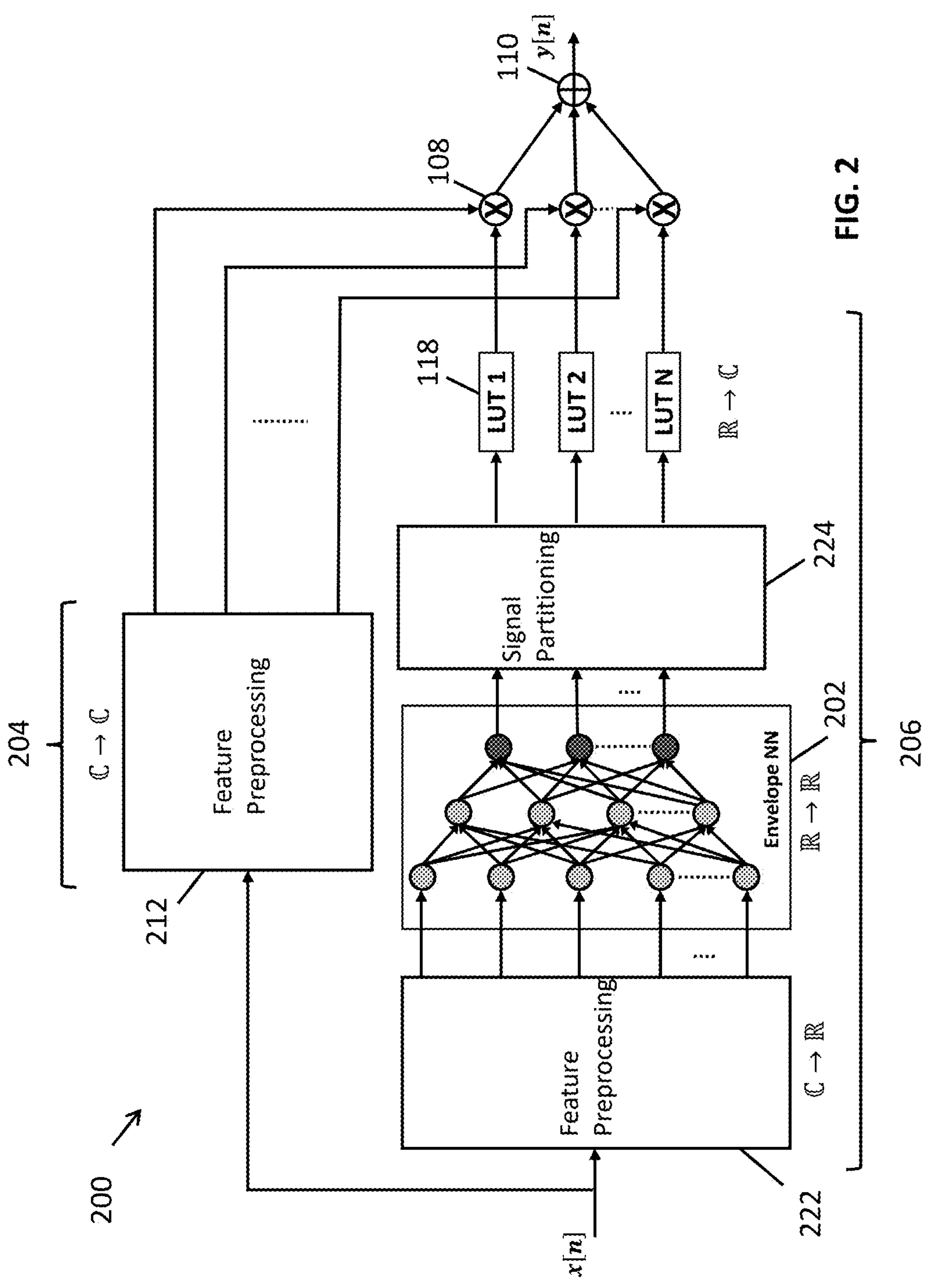
FIG. 2 is a schematic block diagram of a DPD system that includes an envelope neural network (envelope NN) according to an embodiment.

FIG. 2 is a schematic block diagram of a DPD system 200 that includes an envelope neural network (envelope NN) 202 according to an embodiment. The DPD system 200 is arranged to generate a pre-compensated digital output signal y[n] from a baseband digital input signal x[n] based on Equation 3. In the DPD system 200, an artificial neural network is included in an envelope processing path and the feature processing path does not include an artificial neural network. As illustrated, the DPD system 200 includes a feature processing path 204, an envelope processing path 206, multipliers 108, and a combiner 110. Together the feature processing path 204 and the envelope processing path 206 implement feature engineering.

The feature processing path 204 can perform a transformation in a complex-valued domain on the input signal x[n]. Accordingly, the feature processing path 204 can be referred to as a complex feature processing path. The feature processing path 204 includes a feature preprocessing block 212. The feature preprocessing block 212 performs a complex-to-complex transformation on the input signal x[n]. This transformation can transform the input signal x[n] to non-linear dynamics, such as non-linear dynamics from DDR models. The feature preprocessing block 212 can perform a complex multiplication. The complex multiplication can be frequency selective. The feature preprocessing block 212 can model any suitable features. The feature preprocessing block 212 can implement non-linear dynamical terms, such as but not limited to one or more of x*x*conj(x_m), x*x_m*conj(x_m), linear equalization, or nonlinear equalization using finite impulse response filters and/or infinite impulse response filters. In certain applications, the feature preprocessing block 212 can perform the following operations:

$$\prod_{p=1}^{k+1} x[n-m_p] \cdot \prod_{q=k+2}^{2k+1} x^*[n-m_q]$$

The envelope processing path 206 includes a feature preprocessing block 222, the envelope NN 202, a signal partitioning block 224, and a gain block that includes LUTs 118. In the envelope processing path 206, the envelope NN 202 is in series with the gain block. The gain block can include individual non-linear gain blocks (e.g., LUTs 118 in FIG. 2) that apply non-linear gains to outputs of the envelope NN 202. The computations in the envelope processing path 206 are different than the computations performed in the envelope processing path 106 of the DPD system 100 of FIG. 1A. The envelope processing path 206 can be referred to as an envelope feature processing path.

The envelope processing path 206 can derive an envelope of the input signal x[n], provide a delay, and apply a gain function. The envelope processing path 206 can perform a complex-to-real transformation using the feature preprocessing block 222, a real-to-real transformation using the envelope NN 202, and a real-to-complex transformation using the gain block (e.g., the LUTs 118).

The feature preprocessing block 222 can generate input features for the envelope NN 202 to enhance performance of the IQ samples of the input signal x[n] in the envelope NN 202. The feature preprocessing block 222 can perform linear and/or non-linear operations. The feature preprocessing block 222 can take products of samples of the real part or imaginary part of the input signal x[n] and provide a real output signal to the envelope NN 202. The real and imaginary components can be separated and applied to the envelope NN 202. The feature preprocessing block 222 can transform the input signal x[n] from a complex signal to a real signal. In certain applications, the feature preprocessing block 222 can take products of samples of the real part or imaginary part and provide a real output signal to the envelope NN 202. Example operations that can be performed by the feature preprocessing block 222 include but are not limited to Re{x[n–i]}, Im{x[n–i]}, . . . . Re or Im{x[n–i]|x[n–j]|}, . . . . The feature preprocessing block 222 can be implemented in accordance with any suitable principles and advantages disclosed in U.S. patent application Ser. No. 18/36,1697, filed Jul. 28, 2023, and titled “GENERALIZED DIGITAL COMPENSATOR FOR WIRELESS SYSTEMS.” In certain embodiments, the feature preprocessing block 222 can include non-linear processing elements, multiplexers, an arithmetic processing unit (e.g., to perform one or more of the following functions: add, mean, difference, or multiplication block), and an output multiplexer/decoder.

The envelope NN 202 can model envelope features of the input signal x[n]. The signal partitioning block 224 can delay and partition the output signals of the envelope NN 202 for applying a gain function with non-linear gain blocks of the gain block. The gain block can apply a gain function to the envelope signal provided by the envelope NN 202. The gain block can include a plurality of non-linear gain blocks that each apply a non-linear gain on a partition of the envelope signal. The LUTs 118 are examples of such non-linear gain blocks. The LUTs 118 can implement piecewise liner basis functions. For example, the LUTs 118 can implement a weighted sum of basis functions, including orthogonal polynomials, B-splines, or the like. The LUTs 118 can perform a real to complex transformation. The LUTs 118 can be programmed online. For example, the LUTs 118 can be programmed based on an observation receive signal provided to a transceiver integrated circuit. A DPD adaptation circuit can be used to program the LUTs 118.

The envelope NN 202 can be trained offline to determine weights and bias of the envelope NN 202. Such offline training can be performed in a factory before deployment of a system that includes the DPD system 200 and/or during foreground calibration before the system that includes the DPD system 200 is operational for wireless communication. In some instances, the envelope NN 202 can be trained during operation of a system that includes the DPD system 200. This can be referred to as in the field training or online training. The envelope NN 202 can be trained using a relatively small amount of a waveform, such as less than 10% or 5% or less.

The envelope NN 202 can include any suitable number of layers and any suitable number of neurons per layer. Layers can be referred to as hidden layers. There can be at least two hidden layers in the envelope NN 102. The number of neurons and the number of layers can be relatively small for a neural network. In the example illustrated in FIG. 2, there are 3 layers shown in the envelope NN 202. In certain applications, there can be 2 to 10 layers in the envelope NN 202. Different layers can have different numbers of neurons.

Neurons of the envelope NN 202 can be connected any suitable way, such as but not limited to fully connected between layers or partly connected between layers. As illustrated, neurons of the envelope NN 202 are fully connected between layers. The envelope NN 202 can have any suitable neural network architecture, such as but not limited to a FCNN, a CNN, or a LSTM NN.

The multipliers 108 and the combiner 110 can perform multiply sum operations. The multipliers 108 can multiply respective output signals of a first processing path and the envelope processing path 206. As illustrated in FIG. 2, the multipliers 108 can multiply respective output signals of the feature processing path 204 and the envelope processing path 206. The combiner 110 can provide the output signal y[n] that is a digitally predistorted version of the input signal x[n].

Figure 3:
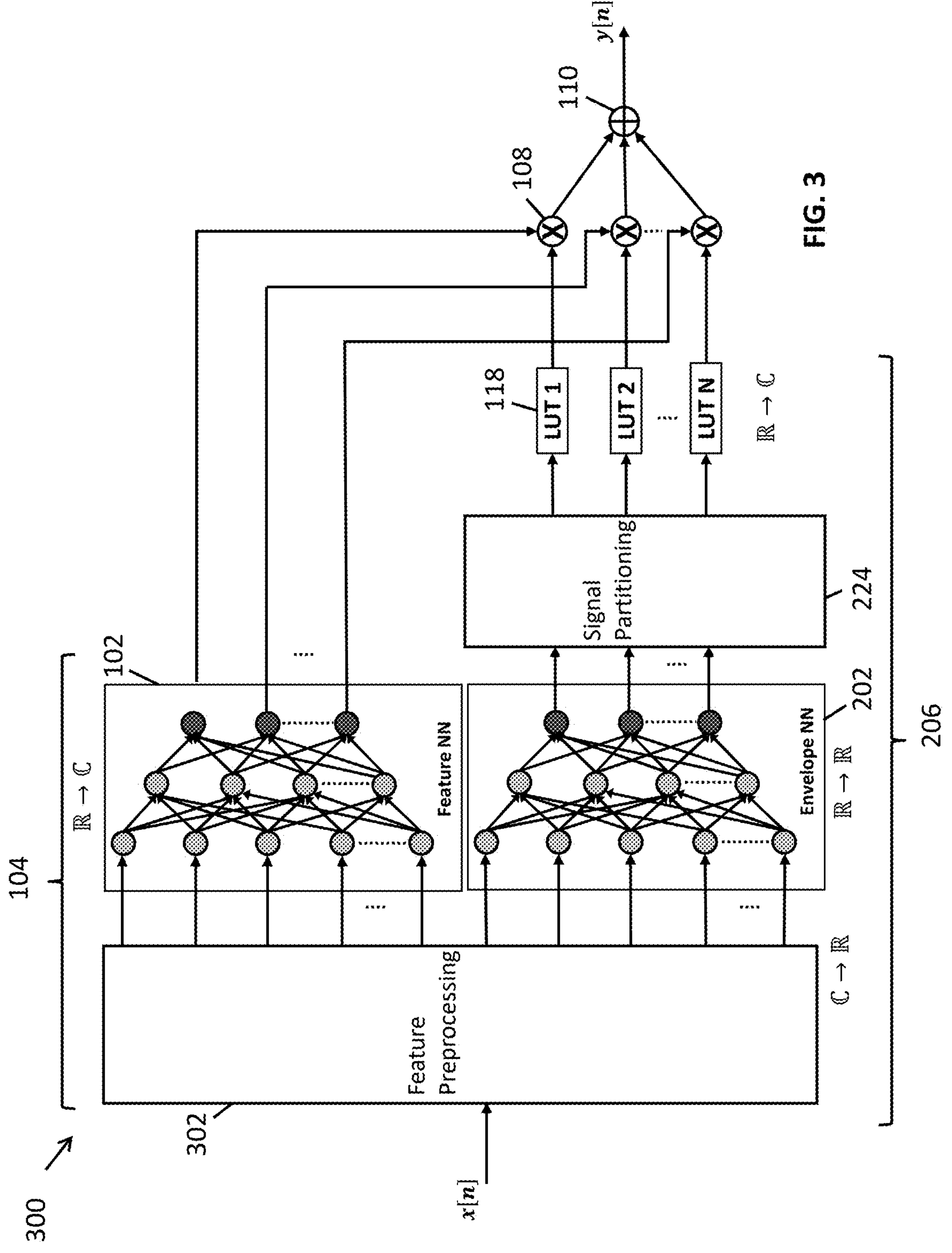
FIG. 3 is a schematic block diagram of a DPD system that includes a feature NN and an envelope NN according to an embodiment.

FIG. 3 is a schematic block diagram of a DPD system 300 that includes a feature NN 102 and an envelope NN 202 according to an embodiment. The DPD system 300 is arranged to generate a pre-compensated digital output signal y[n] from a baseband digital input signal x[n] based on Equation 4. In the DPD system 300, an artificial neural network is included in an envelope processing path and an artificial neural network is included in the feature processing path. As illustrated, the DPD system 300 includes a feature processing path 104, an envelope processing path 206, multipliers 108, and a combiner 110. The DPD system 300 includes the feature processing path 104 of FIG. 1A together with the envelope processing path 206 of FIG. 2. A combined feature processing block 302 can implement the functionality of the feature preprocessing block 112 of FIG. 1A and the feature preprocessing block 222 of FIG. 2.

Figure 4:
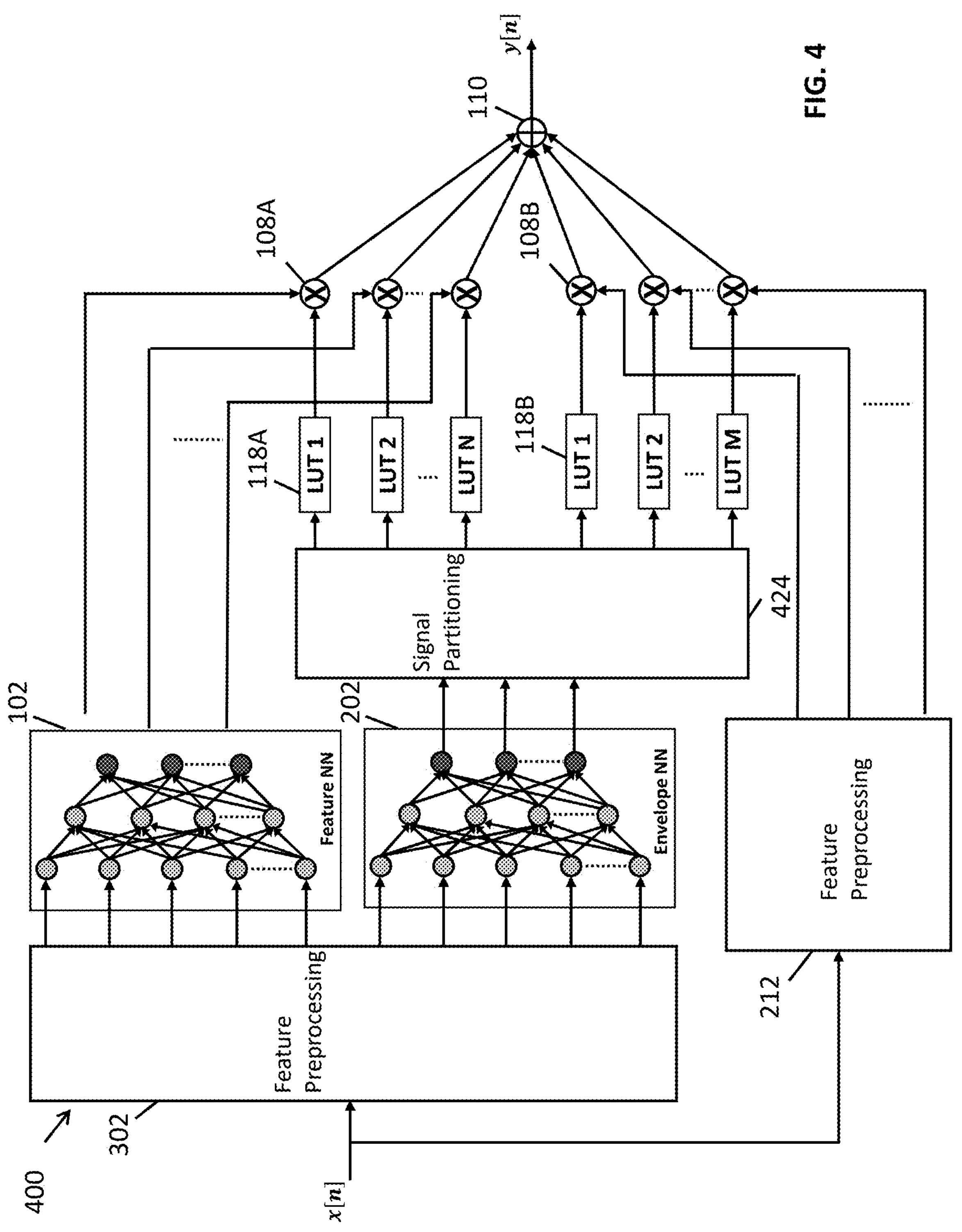
FIG. 4 is a schematic block diagram of a DPD system that includes artificial neural networks according to an embodiment.

FIG. 4 is a schematic block diagram of a DPD system 400 that includes artificial neural networks according to an embodiment. The DPD system 400 combines functionality of the DPD system 300 of FIG. 3 and the DPD system 200 of FIG. 2. In the DPD system 400, a signal partitioning block 424 partitions an output signal from an envelope NN 202 to two sets of non-linear gain blocks. Non-linear gains can be provided in two separate paths, one path for multiplying with outputs of feature NN 102 and another path for multiplying with outputs of the feature preprocessing block 212. As illustrated in FIG. 4, the DPD system 400 includes (1) a first set of LUTs 118A coupled between the signal partitioning block 424 and a first set of multipliers 108A and (2) a second set of LUTs 118B coupled between the signal partitioning block 424 and a second set of multipliers 108B. The combiner 110 can combine outputs of the first set of multipliers 108A and the second set of multipliers 108B.

Various designs of embodiments disclosed herein were evaluated. As discussed above, a feature artificial neural network and/or an envelope artificial neural network can have any suitable neural network architecture. Examples of these neural network architectures can include, but are not limited to, FCNN, CNN, and LSTM NN. Two FNCCs with three hidden layers and a rectifier linear unit (ReLU) activation function were optimized offline for both envelope neural networks and feature neural networks with the parameters summarized in Table 1.

TABLE 1

| | # Inputs | # Hidden Layers | # Neurons per Layer | # Outputs | # Real Multiplications |
|---|---|---|---|---|---|
| Envelope NN | 24 | 3 | [16, 32, 16] | 1 | 1,489 |
| Feature NN | 24 | 3 | [16, 32, 16] | 40 | 2,152 |

For higher performance, the number of envelope NN outputs can be greater than 1. Only 5% of the waveform was used in the training in these design examples. For example, 49,152 samples or 5% of 983,040 samples (sampling at 983.04 MS/s for a duration of 1 ms, 1 subframe of a 5G NR waveform) were used for training in the design examples. The trained models were then applied on the whole waveform for testing.

Figure 5:
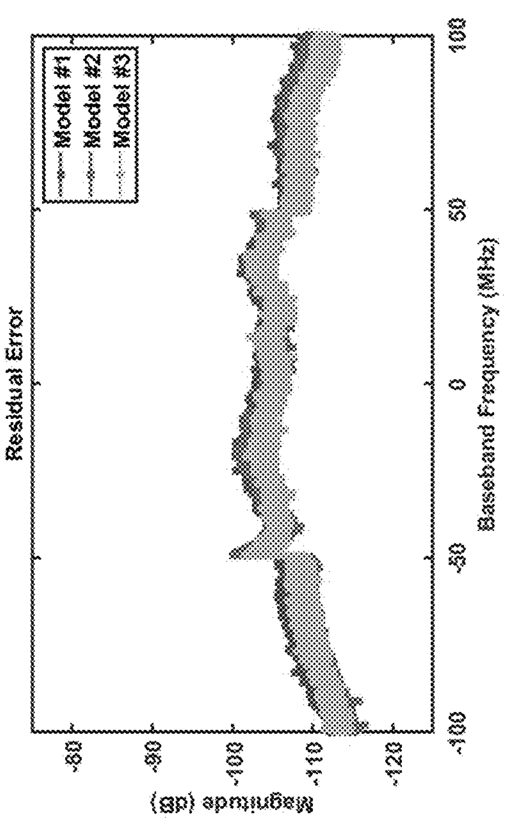
FIG. 5 is a graph of residual error over frequency comparing embodiments corresponding to FIGS. 1A and 2 with a baseline Volterra based DPD.

FIG. 5 is a graph of residual error over frequency comparing embodiments corresponding to FIGS. 1A and 2 with a baseline Volterra based DPD. The neural networks were implemented with the parameters in Table 1. Simulations were run for a wireless communication system with a particular power amplifier with an output power of 47.0 decibels per milliwatt (dBm) and a 1×100 megahertz (MHz) New Radio (NR) waveform at 3.65 gigahertz (GHz). Three models were simulated: (1) a Volterra based DPD system with generalized memory polynomial (GMP), (2) GMP and an envelope NN corresponding to the DPD system 100 of FIG. 2, and (3) GMP and a feature NN corresponding to the DPD system 200 of the FIG. 1A. Residual error for these simulations is graphed in FIG. 5.

The simulations indicate lower emission level across frequencies for the DPD system 100 and the DPD system 200 compared to the Volterra based DPD system. The simulations indicate better in band and output of band performance for the DPD system 100 and the DPD system 200 compared to the Volterra based DPD system. The simulation results are summarized in Table 2. Table 2 shows the normalize mean squared error (NMSE) in decibels (dB) for the three models simulated. NMSE was reduced for the DPD system 100 and the DPD system 200 compared to the Volterra based system. The DPD system 200 had more features and better performance than the DPD system 100 in these simulations.

TABLE 2

| Model # | Model | # Features | NMSE (dB) |
|---|---|---|---|
| 1 | GMP | 190 | −37.0 |
| 2 | GMP + Envelope NN (FIG. 2) | 190 | −37.4 |
| 3 | GMP + Feature NN (FIG. 1A) | 210 | −38.1 |

Figure 6:
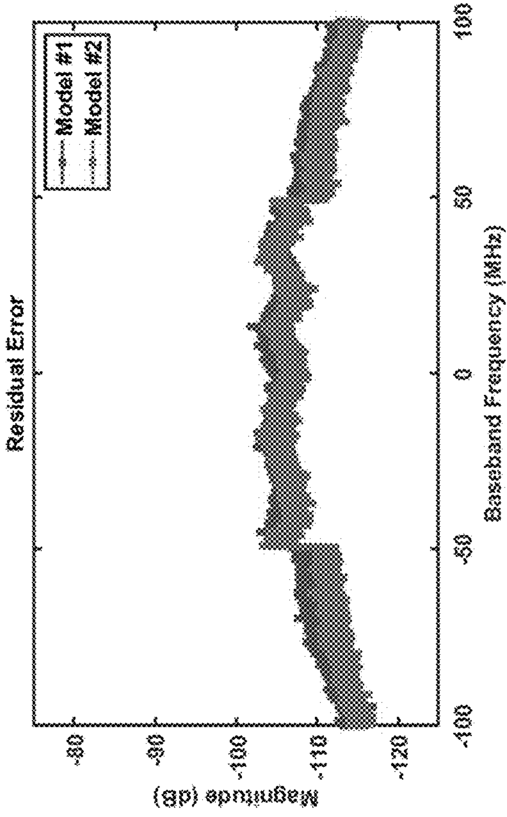
FIG. 6 is a graph of residual error over frequency comparing an embodiment corresponding to FIG. 4 with the baseline Volterra based DPD.

FIG. 6 is a graph of residual error over frequency comparing an embodiment corresponding to FIG. 4 with Volterra based DPD. The neural networks were implemented with the parameters in Table 1. Simulations were run for a wireless communication system with a particular power amplifier with an output power of 47.0 dBm and a 1×100 megahertz MHz NR waveform at 3.65 GHz. Two models were simulated: (1) a Volterra based DPD system with GMP and DDR and (2) GMP, an envelope NN, and a feature NN corresponding to the DPD system 400 of FIG. 4. FIG. 6 is a graph of residual error for these simulations.

The simulations indicate lower emission level across frequencies for the DPD system 400 compared to the Volterra based DPD system. The simulations indicate better in band and output of band performance for the DPD system 400 compared to the Volterra based DPD system. The simulation results are summarized in Table 3. Table 3 shows the NMSE for the two models simulated. NMSE was reduced for the DPD system 400 compared to the Volterra based system. This reduction was 0.7 dB in the simulations. Table 3 also indicates that fewer features can be used in the DPD system 400 than in the Volterra based DPD system with GMP and DDR. In addition, Table 3 indicates that fewer samples can be used for the DPD system 400 (7 to the past and 0 to the future) compared to the Volterra based DPD system with GMP and DDR (11 to the past and 4 to the future).

TABLE 3

| Model # | Model | Memory Depth | # Features | NMSE (dB) |
|---|---|---|---|---|
| 1 | GMP + DDR | −11 to +4 | 255 | −39.0 |
| 2 | GMP + Envelope NN + Feature NN (FIG. 4) | −7 to 0 | 210 | −39.7 |

Additional measurement results for the two models simulated for generating the graph of FIG. 6 are provided in Table 4. For these measurements, LUTs were trained online and the neural networks in the DPD system 400 were trained offline. These measurements indicate improvement in adjacent channel leakage ratio (ACLR) and spectrum emission mask (SEM) for the DPD system 400 compared to the Volterra based DPD system with GMP and DDR.

TABLE 4

| Model # | Model | Training Style | NMSE (dB) | ACLR (dBc) | SEM (dBm) |
|---|---|---|---|---|---|
| 1 | GMP + DDR | LUTs trained online | −40.0 | −49.1 | −17.7 |
| 2 | GMP + Envelope NN + Feature NN (FIG. 4) | LUTs trained online NNs trained offline | −40.7 | −50.0 | −19.7 |

In certain applications, DPD systems can combine hybrid Neural Volterra processing with Volterra based processing. In such systems, there can be a relatively small number of system behaviors modeled by a relatively small artificial neural network and Volterra processing can model other system behaviors for digital compensation. This can strike a desirable balance between power, area, and performance tradeoffs in various applications. Examples of DPD systems with hybrid Neural Volterra processing and Volterra processing will be discussed with reference to FIGS. 7 and 8.

Figure 7:
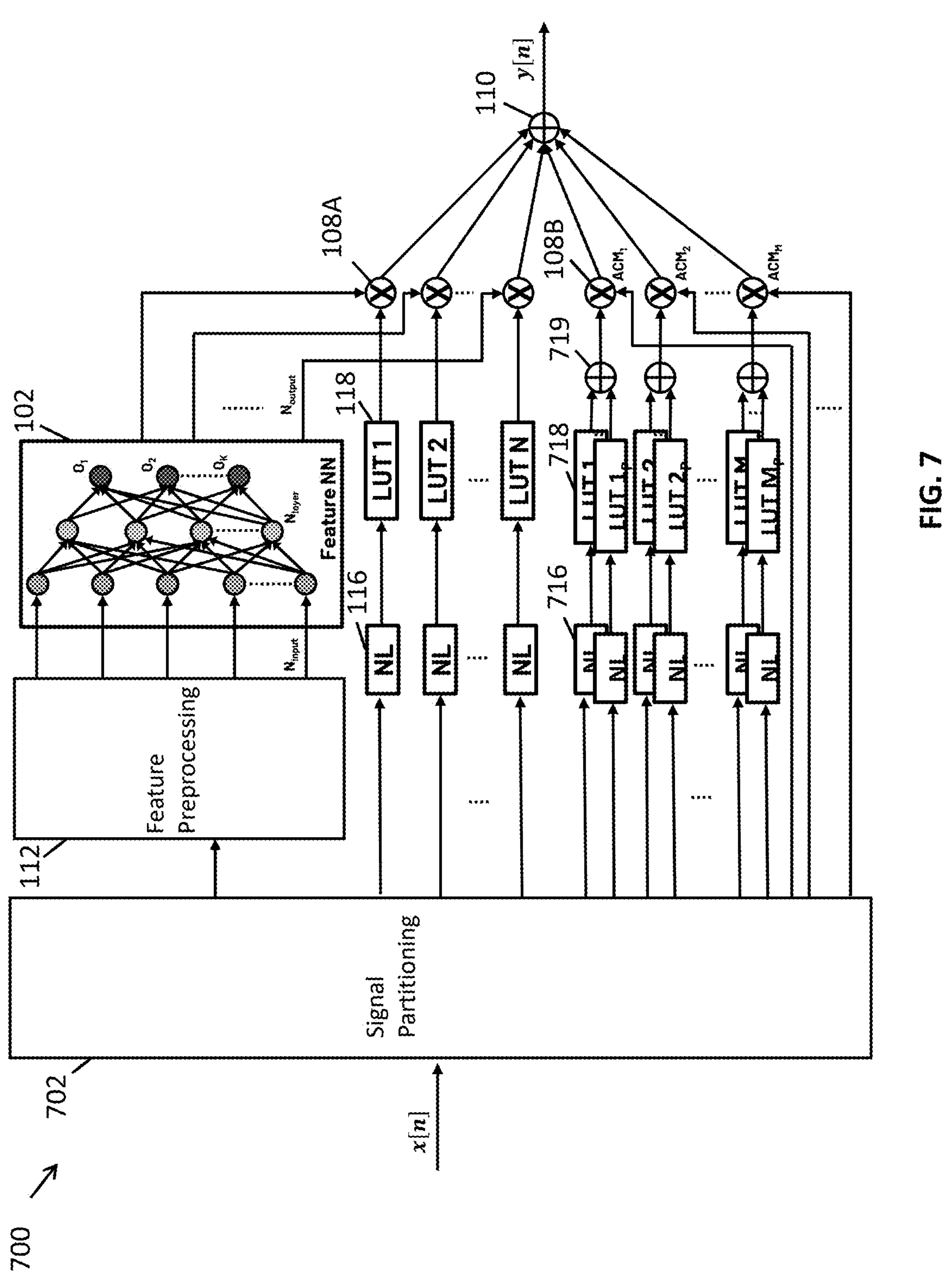
FIG. 7 is a schematic block diagram of a DPD system that includes a combination of Neural Volterra processing and Volterra processing according to an embodiment.

FIG. 7 is a schematic block diagram of a DPD system 700 that includes a combination of Neural Volterra processing and Volterra processing according to an embodiment. A signal partitioning block 702 can partition the input signal x[n] for the processing paths of the DPD system 700. The signal partitioning block 702 can also implement a delay. In certain applications, the Volterra processing blocks can model different features than the Neural Volterra processing. For example, the Volterra processing can model simpler features than the Neural Volterra processing.

The DPD system 700 includes Neural Volterra processing similar to the DPD system 100 of FIG. 1A and Volterra processing. The feature NN 102 of the DPD system 700 can be a relatively small network that models a relatively small number of system behaviors. A first set of multipliers 108A can multiply outputs of the feature NN 102 and an envelope processing path.

Volterra processing blocks of the DPD system 700 include non-linear processing blocks 716, a gain block comprising LUTs 718, a combining block comprising a set of combiners 719, and a second set of multipliers 108B. The non-linear processing block can receive partitioned signals from the signal partitioning block 702. The gain block can apply a gain function, for example, using LUTs 718. The set of combiners 719 can add or otherwise combine outputs from the gain block. For instance, the combining block can include a set of individual combiners 719 that each combine output signals from a group of two or more of the LUTs 718. The second set of multipliers 108B can multiply output signals from the combining block with respective signals from the signal partitioning block 702. In some applications, the second set of multipliers 108B can multiply output signals from the combining block with respective output signals from a feature preprocessing block, such as a feature preprocessing block 212 of FIG. 2 or FIG. 4.

Figure 8:
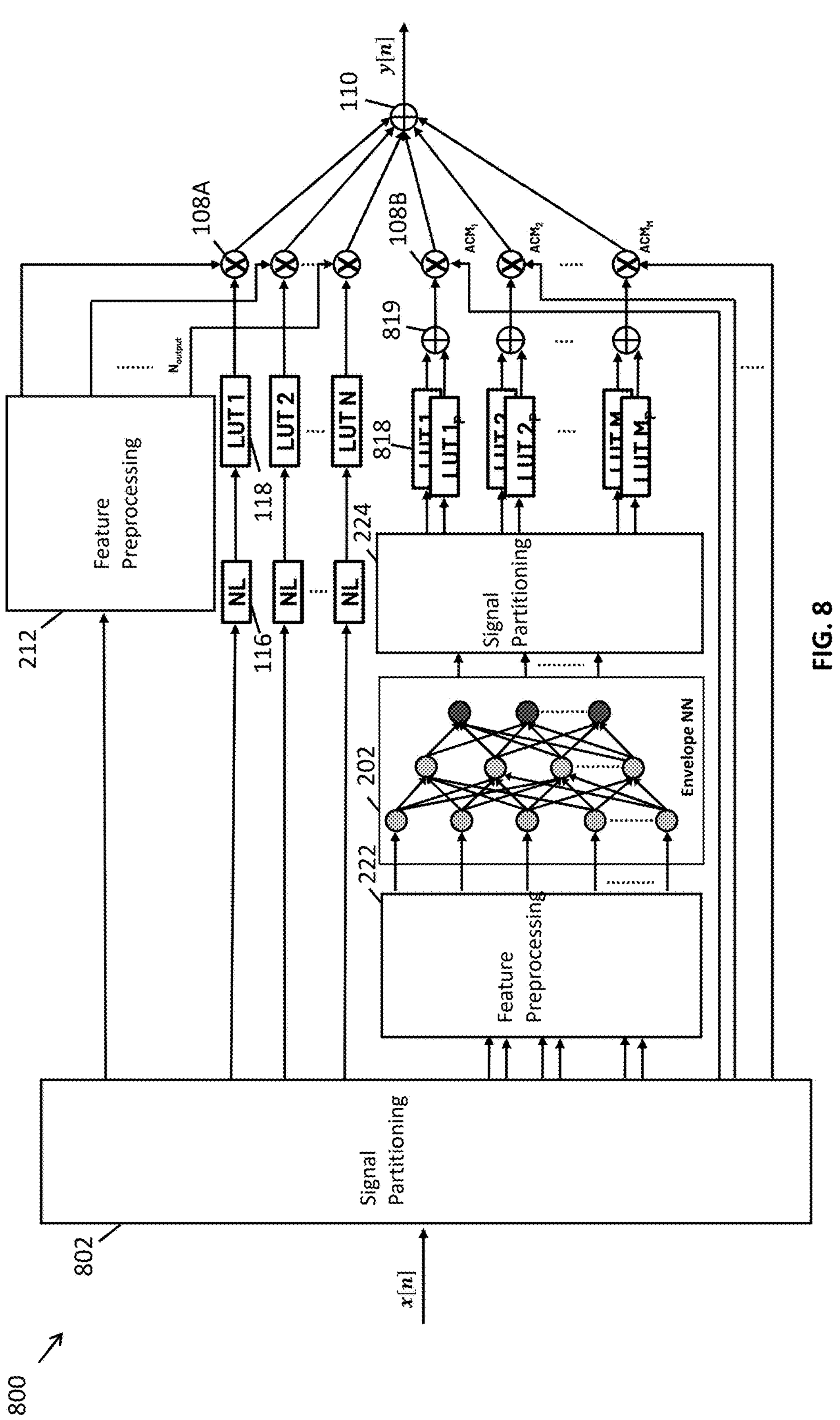
FIG. 8 is a schematic block diagram of a DPD system that includes a combination of Neural Volterra processing and Volterra processing according to another embodiment.

FIG. 8 is a schematic block diagram of a DPD system 800 that includes a combination of Neural Volterra processing and Volterra processing according to an embodiment. A signal partitioning block 802 can partition the input signal x[n] for the processing paths of the DPD system 800. The signal partitioning block 802 can also implement a delay. In the DPD system 800, Volterra processing can include summing multiplications of outputs of the feature processing path 204 of the DPD system 200 of FIG. 2 with outputs of the envelope processing path 106 of the DPD system 100 of FIG. 1A. The DPD system 800 also includes Neural Volterra processing that includes an envelope NN 202 and other components of the envelope processing path 206 of FIG. 2. The Neural Volterra processing of the DPD system 800 also includes summing or otherwise combining outputs of LUTs 818 with a set of combiners 819. This can increase a ratio of outputs of the envelope NN 202 to complex multiplications by the second set of multipliers 108B. The combiner 110 can combine output signal from a first set of multipliers 108A and a second set of multipliers 108B to generate an output signal y[n] that is a digitally predistorted version of the input signal x[n]. The second set of multipliers 108B can multiply output signals from the envelope processing path that includes the envelope NN 202 and output signals from the signal partitioning block 802. In some applications, the second set of multipliers 108B can multiply output signals from the envelope processing path that includes the envelope NN 202 and respective output signals from a feature preprocessing block, such as a feature preprocessing block 212 of FIG. 2 of FIG. 4.

In the DPD systems disclosed herein, a mapping ratio can be the number of feature NN outputs to the number of the actual features contributed to the hybrid model. In the design example corresponding to the simulations of FIGS. 5 and 6, a mapping ratio of 2:1 was used. Each set of two real outputs of the Feature NN adds one complex feature to the hybrid model. A unity gain function (φ) was used with no signal partitioning for LUTs $m_q$ (where m: 1→M, q: 1→Q). Mapping ratio can be increased by utilizing the non-linear transformations (basis functions) in φ using LUTs and adding more signal partitioning to LUTs $m_q$. Increasing mapping ratio can result in performance enhancement with less overall model complexity. The implementation area and power consumption for LUTs and signal partitioning can be quite cheap compared to the implementation and power consumption to increase the number of outputs of a neural network. Accordingly, increase mapping ratio can reduce physical area.

Figure 9:
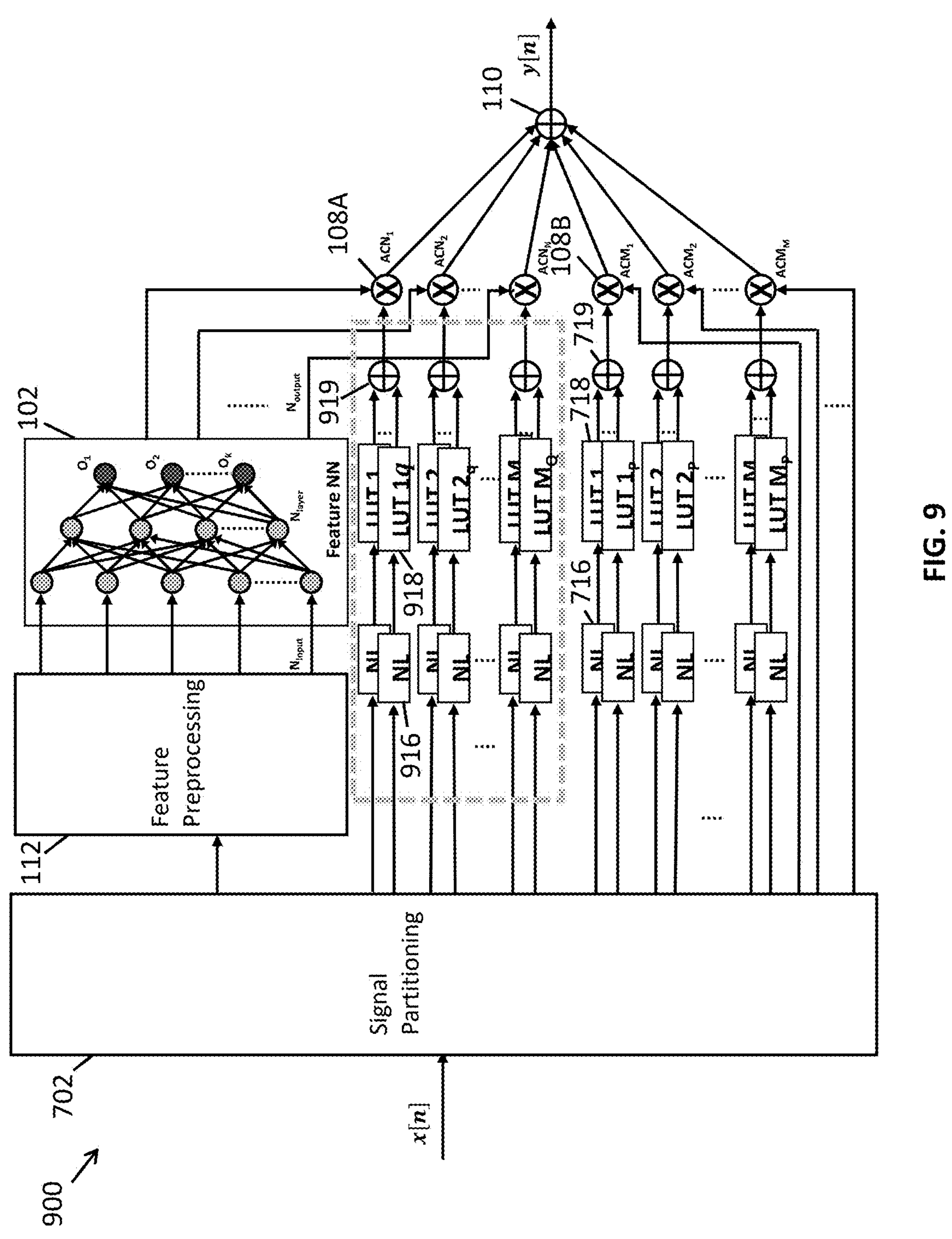
FIG. 9 is a schematic block diagram of a DPD system with a mapping ratio of greater than 2:1 according to an embodiment.

FIG. 9 is a schematic block diagram of a DPD system 900 with a mapping ratio of greater than 2:1 according to an embodiment. The DPD system 900 is like the DPD system 700 of FIG. 7, except that the DPD system 900 has a higher mapping ratio. To achieve the higher mapping ratio, more basis functions can be generated and combined in the envelope processing path for multiplying with outputs of the feature NN 102. This can involve a gain block applying more non-linear transformations and then summing outputs of these transformations before multiplication with outputs of a feature processing path. As illustrated in FIG. 9, there are more non-linear processing blocks 916 and LUTs 918 included in the DPD system 900 than non-linear processing blocks 116 and LUTs 118 in the DPD system 700. Combiners of the combiners 919 can add a group of outputs of a plurality of LUTs 918 to increase the mapping ratio relative to the mapping ratio in the DPD system 700. The mapping ratio can be increased by having outputs of the feature NN 102 maps to more outputs of the gain block.

Mapping ratio was analyzed in example design examples of the DPD system 900. The number of outputs of the feature NN 102 were halved for mapping ratio design examples with increased mapping ratios (Feature NN 2 to Feature NN 5) of the DPD system 900 relative to the base case with mapping ratio of 2:1 (Feature NN 1). The base case corresponds to the DPD system 700 of FIG. 7. In these mapping ratio design examples, the feature NN 102 has the same size as for the design examples corresponding to the graphs of FIGS. 5 and 6. The feature NN 102 has 3 hidden layers with 16, 32, and 16 neurons per layer in the design example. Additional parameters and simulation results for the mapping ratio design examples are summarized in Table 5.

TABLE 5

| | # Outputs | # Real Multipli-cations | # Non-linear Transfor-mations | # Delays | Mapping Ratio | Simu-lated NMSE (dB) |
|---|---|---|---|---|---|---|
| Feature NN 1 | 40 | 2,152 | 1 | 1 | 2:1 | −38.1 |
| Feature NN 2 | 20 | 1,284 | 1 | 6 | 12:1 | −40.3 |
| Feature NN 3 | 20 | 1,284 | 6 | 1 | 12:1 | −41.0 |
| Feature NN 4 | 20 | 1,284 | 6 | 6 | 72:1 | −41.6 |
| Feature NN 5 | 20 | 1,284 | 4 | 8 | 64:1 | −42.0 |

Table 5 indicates that mapping ratio can have a significant impact on performance. For example, the mapping ratio design example with Feature NN 5 has a reduction of approximately 4 dB NMSE relative to the mapping ratio design example with Feature NN 1. The NMSE improvements achieved with Feature NN 2 to Feature NN 5 are significant. At the same time, the mapping ratio design example with Feature NN 5 can be implemented a smaller physical area (e.g., roughly half) compared to the mapping ratio design example with Feature NN 1.

Although mapping ratio is discussed with reference to the DPD system 900 of FIG. 9, the mapping ratio of any suitable embodiment disclosed herein can be increased. For example, the mapping ratio of any of the DPD systems of FIG. 1A, 1B, 3, 4, 7, or 10 can be increased in accordance with any suitable principles and advantages disclosed herein. More generally, a set of combiners can be included in any suitable processing path disclosed herein to combine partitioned signals prior to complex multiplication.

Artificial neural networks disclosed herein can be trained for different system states. Example system states include but are not limited to power consumption such as power amplifier power consumption, temperature such as power amplifier temperature, voltage standing wave ratio (VSWR), radio frame switching, power supply level such as power amplifier supply voltage level, or the like. Data analytics can be derived at the intelligent edge by incorporating on-chip analog sensor information in the design of an Envelope NN and/or a Feature NN. Such neural networks can learn and compensate for the system state. Accordingly, performance of such DPD systems can account for a variety of system conditions and provide robust DPD. The system state provides an extra degree of freedom in DPD system design.

Figure 10:
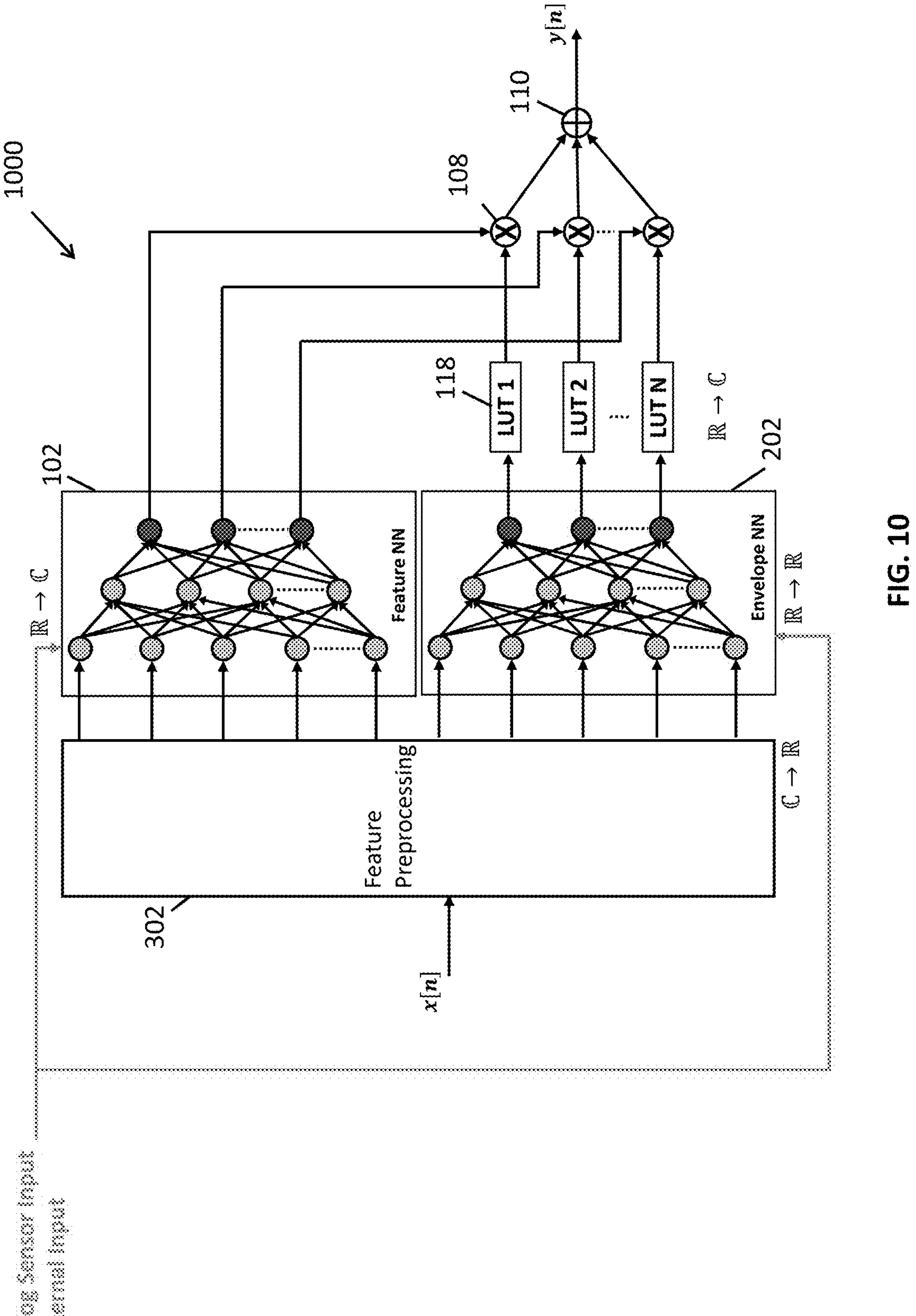
FIG. 10 is a schematic block diagram of a DPD system with artificial neural networks configured to receive a sensor input signal and/or an external input signal according to an embodiment.

FIG. 10 is a schematic block diagram of a DPD system 1000 with artificial neural networks configured to receive a sensor input signal according to an embodiment. The DPD system 1000 is like the DPD system 300 of FIG. 3 except that the feature NN 102 and the envelope NN 202 each have inputs configured to receive an input signal from outside of the processing path that includes the respective NN in DPD system 1000. The feature NN 102 and the envelope NN 202 can be trained based on various input signals and use the input signals in generating output signals in the DPD system 1000. The input signal can be a sensor input signal or an external input signal. Accordingly, in the DPD system 1000, the feature NN 102 and the envelope NN 202 can account for system conditions. This can provide robust DPD under a variety of system conditions.

The input signal can be a sensor signal (e.g., an analog sensor input signal) or an external input signal. The sensor signal can be provided by a sensor that is included in the same transceiver integrated circuit as a DPD system. In some instances, two or more sensor input signals can be provided to an artificial neural network by two or more sensors. The sensor input signal can be a power consumption signal, a temperature signal, a VSWR signal, a radio frame switching signal, a power supply signal, or the like. As one example, the sensor input signal can be a temperature signal and the feature NN 102 and the envelope NN 202 can generate different outputs for a lower temperature state than a higher temperature state. As another example, the sensor input signal can be a power signal and the feature NN 102 and the envelope NN 202 can generate different outputs for a lower power state than a higher power state. Any suitable sensor input signal can be associated with a power amplifier for which the DPD system is reducing non-linearity and/or for another power amplifier of a communication system.

The input signal can be an external input signal provided from outside of the DPD system 1000. For example, an external input signal can be a digital signal or a periodic sequence that carries certain timing information. As another example, in a time interleaving architecture, the rising edge and falling edge of the clock can be an external input signal to trigger the feature NN 102 and/or the envelope NN 202 to learn certain behavior near the clock edge. As one more example, the external input signal can be a Time Division Duplex (TDD) trigger signal. In this example, the rising edge of the TDD trigger signal can inform the feature NN 102 and/or the envelope NN 202 that valid data is coming to a radio, and hence train a DPD actuator to compensate for any non-ideal behavior happening during the transition of the TDD signal from data off to data on. In some applications, the external input signal can be provided from outside of the DPD system 1000.

The sensor input signal can be used by any of the artificial neural networks disclosed herein. Although both a feature NN 102 and an envelope NN 202 receive the sensor input signal in the DPD system, one of these artificial neural networks can receive the sensor input signal in certain applications or the sensor input signal can be provided to an artificial neural network in a DPD system that includes a single artificial neural network in some applications.

Figure 11:
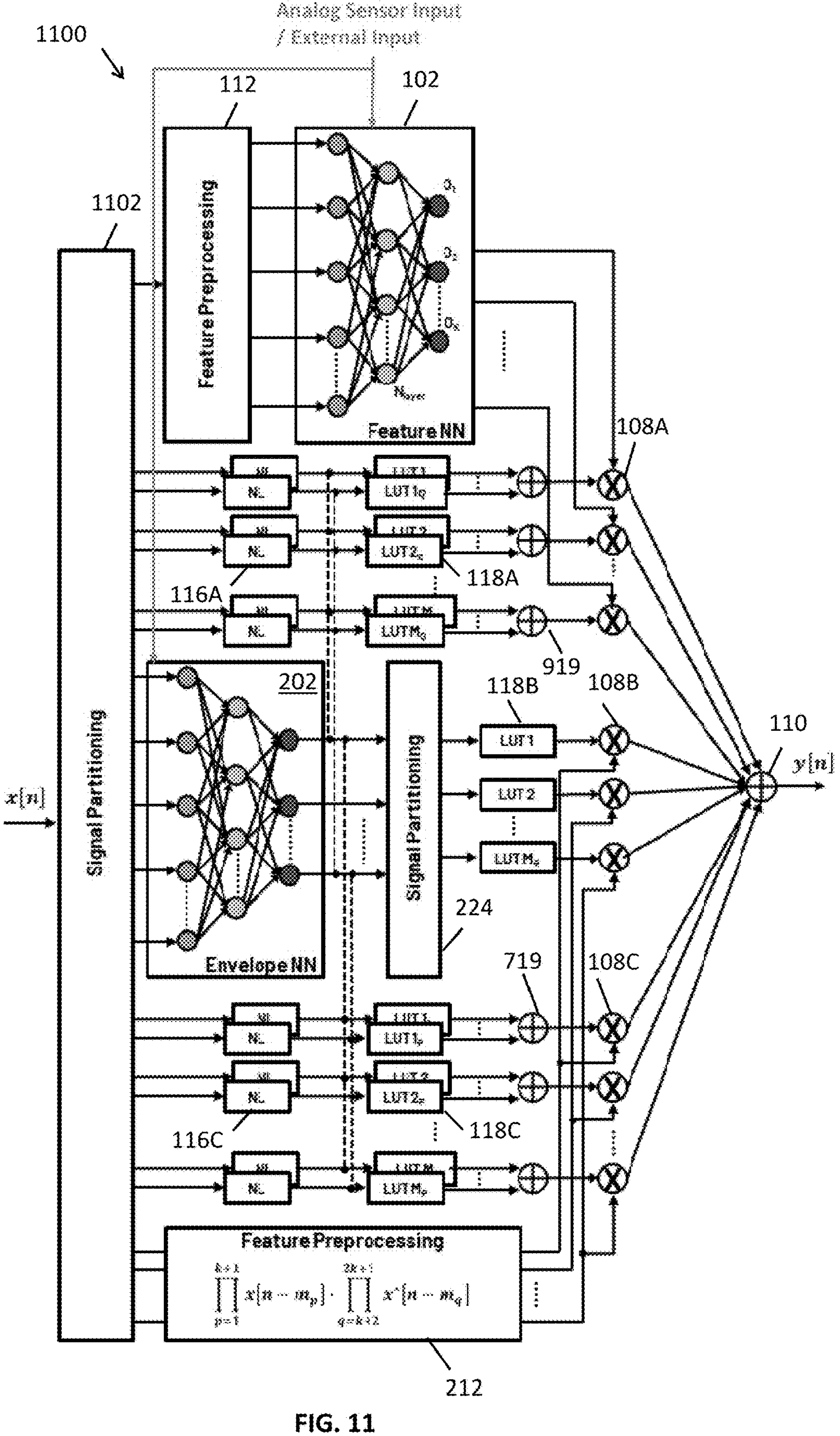
FIG. 11 is a schematic diagram of DPD system with Neural Volterra processing and Volterra processing according to an embodiment.

FIG. 11 is a schematic diagram of DPD system 1100 with Neural Volterra processing and Volterra processing according to an embodiment. Any suitable principles and advantages of the DPD systems disclosed herein can be combined as suitable. The DPD system 1110 includes a combination of processing blocks of other DPD systems of this disclosure.

In the DPD system 1100, an input signal x[n] is partitioned for a plurality of processing paths by the signal partitioning block 1102. The signal partitioning block 1102 can also apply a delay. The DPD system 1100 includes (1) Neural Volterra processing of the DPD system 100 of FIG. 1A and combiners 919 to increase a mapping ratio, (2) Neural Volterra processing of the DPD system 300 of FIG. 3, and (3) a Volterra processing portion of the DPD system 700 that uses a common feature preprocessing block 212 with the Neural Volterra processing of the DPD system 300. The feature NN 102 and the envelope NN 202 can receive a sensor input signal and/or an external input signal. Separate sets of multipliers 108A, 108B, and 108C are included in the DPD system 1100 for (1), (2), and (3), respectively. A combiner 110 can combine output signals from the multipliers 108A, 108B, and 108C. The DPD system 1100 is one example of combing processing blocks of other embodiments. Any other suitable combinations of processing blocks or subsets of processing blocks of other embodiments can be implemented.

Figure 12:
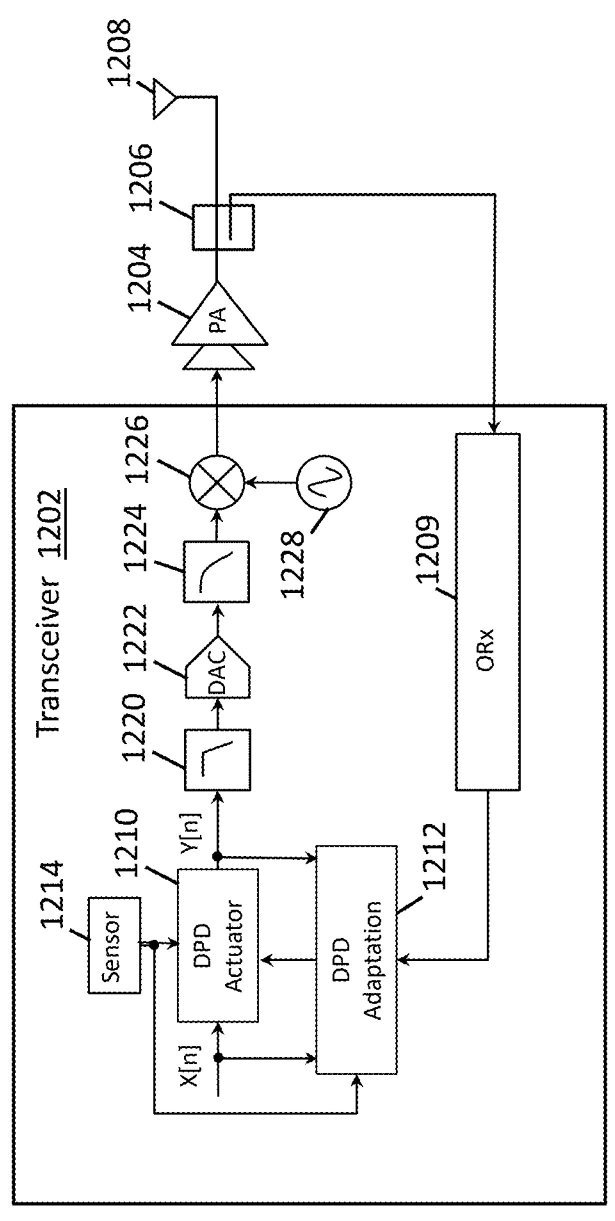
FIG. 12 is a schematic diagram of a communication system that includes DPD according to an embodiment.

Communication systems can include transceiver integrated circuits that include DPD systems disclosed herein. FIG. 12 is a schematic diagram of a communication system 1200 that includes DPD according to an embodiment. As illustrated, the communication system 1200 includes a transceiver integrated circuit 1202, a power amplifier 1204, a radio frequency coupler 1206, and an antenna 1208.

The transceiver integrated circuit 1202 can provide a radio frequency signal for amplification by the power amplifier 1204. The antenna 1208 can wirelessly transmit the amplified radio frequency signal provided by the power amplifier 1204. In some applications, a communication system 1200 can include a relatively large number of antennas and/or preform beamforming. The radio frequency coupler 1206 can provide an indication of power of the radio frequency signal provided to the antenna 1208 to the transceiver integrated circuit.

The transceiver integrated circuit 1202 can include a DPD system, a transmitter, and an observation receiver 1209. The DPD system of the transceiver integrated circuit 1202 includes a DPD actuator 1210 and a DPD adaptation circuit 1212. The DPD actuator 1210 can be implemented in accordance with any suitable principles and advantages of any of the DPD systems disclosed herein. As shown in FIG. 12, the DPD actuator 1210 can receive a sensor input signal from a sensor 1214 of the transceiver integrated circuit 1202. The sensor input can be provided to one or more artificial neural networks of the DPD actuator 1210 to implement any suitable principles and advantages discussed with reference to FIG. 10. The sensor 1214 can be any suitable sensor, such as but not limited to a temperature sensor, a supply voltage sensor, a VSWR sensor, or the like. In some applications, the transceiver integrated circuit 1202 can include two or more sensors 1214.

The observation receiver 1209 can process the indication of radio frequency power from the radio frequency coupler 1206 and provide an observation receive input to the DPD adaptation circuit 1212. The DPD adaptation circuit 1212 can also receive an input signal x[n] and an output signal y[n] of the DPD system. In addition, the DPD adaptation circuit 1212 can receive the sensor input signal from the sensor 1214. The DPD adaptation circuit 1212 can update predistortion coefficients and provide the updated predistortion coefficients to the DPD actuator 1210.

The DPD actuator 1210 can provide a digitally predistorted output signal y[n] to a transmitter. The transmitter can include a digital filter 1220, a digital-to-analog converter

1222, an analog filter 1224, and an upconverter 1226 that is connected to an oscillator 1228. A variety of other transmitter architectures can be used in some other applications, such as transmitters with digital upconverters, etc. The transmitter can include in-phase and quadrature paths, where the illustrated transmitter path is one of the in-phase path or the quadrature path.

This disclosure provides hybrid Neural Volterra DPD systems that can implement mathematical formulations of Volterra series. Higher modeling accuracy is demonstrated by augmenting parts of the Volterra formulation using one or more artificial neural networks. For example, an envelope NN and/or a feature NN can be included in a DPD system. Custom basis functions can be implemented for LUTs, which can also be optimized using neural networks. Training of an envelope NN and feature NN can be performed on a group basis in certain applications.

Feature preprocessing and engineering in conjunction with using one or more artificial neural networks allows for exploiting analog sensor input, such as temperature, power meter, VSWR, power supply level, radio frame timing, or the like, to enhance the robustness and universality of the model against varying environmental conditions. This can simplify the programmable design and implementation of Volterra features and envelopes.

Hybrid Neural Volterra models can be trained in a variety of ways. Example model training can include one or more of: (1) training and/or optimizing an envelope NN and/or a feature NN during foreground calibration and/or factory calibration; (2) training and/or optimizing non-linear gain blocks, such as LUTs, in the field; (3) training and/or optimizing non-linear gain blocks, such as LUTs, a feature NN in the field; (4) training and/or optimizing non-linear gain blocks, such as LUTs, an envelope NN in the field; or (5) training and/or optimizing non-linear gain blocks, such as LUTs, a feature NN, and an envelope NN in the field.

A variety of pruning algorithms can be used to train the weights and neurons for an envelope NN and/or a feature NN. This can result in lower power consumption and smaller implementation area.

Neural Volterra architectures disclosed herein can be adopted in multistage cascades.

In embodiments of this disclosure, circuits, systems and methods are described in connection with particular embodiments. It will be understood, however, that any suitable principles and advantages of the embodiments of this disclosure can be used for any other systems, apparatus, electronic devices, or methods with a need for the technology disclosed herein, such as DPD systems or other digital compensators. Moreover, any suitable principles and advantages disclosed herein can be implemented in systems and in methods that include a DPD system for reducing nonlinearity of a power amplifier. The elements and acts of the various embodiments of this disclosure can be combined to provide further embodiments. The acts of the methods discussed herein can be performed in any order as appropriate. Moreover, the acts of the methods discussed herein can be performed serially or in parallel, as appropriate.

The principles and advantages described herein can be implemented in various apparatuses. Examples of such apparatuses can include, but are not limited to, communications infrastructure such as wireless communications infrastructure, consumer electronic products, parts of the consumer electronic products, electronic test equipment, vehicular electronics products, industrial electronics products, etc. Electronic products can include, but are not limited to, base stations such as cellular base stations, access points, repeaters, relays, wireless communication devices, a mobile phone (for example, a smart phone), a hand-held computer, a tablet computer, a laptop computer, a wearable computing device, a vehicular electronics system, a radio, a wearable health monitoring device, etc. Further, apparatuses can include unfinished products.

Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

Unless the context clearly requires otherwise, throughout the disclosure and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used in this disclosure, refer to two or more elements that may be either directly connected, or connected by way of one or more intermediate elements. Additionally, the words "herein," "above," "below," and words of similar import, when used in this application, shall refer to this application as a whole and not to any particular portions of this application.

Where the context permits, words in this disclosure using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

While certain embodiments have been described, these embodiments have been presented by way of example only, and are not intended to limit the scope of the disclosure. Indeed, the circuits, systems, and methods of this disclosure may be embodied in a variety of other forms. Furthermore, various omissions, substitutions and changes in the form of the methods, circuits, modules, and systems described herein may be made without departing from the spirit of the disclosure. Such changes and modifications are to be understood as being included within the scope of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described herein can be combined to provide further embodiments. The various features and processes described above may be implemented independently of one another or may be combined in various ways. All possible combinations and sub-combinations of features of this disclosure are intended to fall within the scope of this disclosure.

What is claimed is:

1. A digital predistortion system comprising:

a first processing path configured to process an input signal;

an envelope processing path configured to derive an envelope of the input signal and apply a non-linear gain function, the envelope processing path comprising an envelope artificial neural network;

multipliers configured to multiply respective output signals of the first processing path and the envelope processing path; and a combiner configured to generate a combined output signal based on at least output signals of the multipliers and output the combined output signal, the combined output signal being a digitally predistorted version of the input signal.

2. The digital predistortion system of claim 1, wherein the envelope processing path further comprises a feature preprocessing block configured to transform the input signal from a complex signal to a real signal, the feature preprocessing block having an output coupled to an input of the envelope artificial neural network.

3. The digital predistortion system of claim 1, wherein the envelope processing path further comprises:

a signal partitioning block configured to delay and partition a signal provided by the envelope artificial neural network; and a gain block comprising a plurality of non-linear gain blocks configured to apply non-linear transformations to implement the non-linear gain function, the gain block coupled between the signal partitioning block and the multipliers.

4. The digital predistortion system of claim 3, wherein the plurality of non-linear gain blocks comprises look up tables.

5. The digital predistortion system of claim 3, further comprising a set of combiners coupled between the plurality of non-linear gain blocks and the multipliers, each combiner of the set of combiners configured to combine outputs of a group of non-linear gain blocks of the plurality of non-linear gain blocks.

6. The digital predistortion system of claim 3, further comprising:

a second set of multipliers; and a second set of non-linear gain blocks coupled between the signal partitioning block and the second set of multipliers, wherein the combiner is configured to combine at least the output signals of the multipliers and output signals of the second set of multipliers to generate the combined output signal.

7. The digital predistortion system of claim 1, wherein the envelope artificial neural network is configured to receive at least one of a sensor input signal or an external input signal.

8. The digital predistortion system of claim 1, wherein the envelope artificial neural network has a plurality of outputs.

9. The digital predistortion system of claim 1, wherein the first processing path comprises a feature preprocessing block configured to perform a complex-to-complex transformation, and wherein the feature preprocessing block is configured to perform complex multiplications.

10. The digital predistortion system of claim 1, wherein the first processing path comprises a feature artificial neural network.

11. The digital predistortion system of claim 1, further comprising:

Volterra processing blocks comprising non-linear processing blocks, non-linear gain blocks having inputs connected to outputs of the non-linear processing blocks, a set of combiners each configured to combine output signals of at least two of the non-linear gain blocks, and a second set of multipliers coupled to the set of combiners, wherein the combiner is configured to combine output signals of the second set of multipliers with the output signals of the multipliers to generate the combined output signal.

12. The digital predistortion system of claim 1, wherein a transceiver integrated circuit includes the digital predistortion system.

13. The digital predistortion system of claim 1, wherein the input signal is a digital baseband signal that comprises a data stream of in-phase and quadrature samples, and wherein the digital predistortion system is configured to perform sample rate digital predistortion.

14. A method of digital predistortion, the method comprising:

transforming a digital input signal in a complex-valued domain;

generating an envelope signal from the digital input signal using at least an envelope artificial neural network;

applying a non-linear gain function to the envelope signal;

multiplying signals generated by the transforming with signals generated by the applying; and generating a combined output signal based on at least output signals generated by the multiplying, wherein the combined output signal is a digitally predistorted version of the digital input signal.

15. The method of claim 14, wherein the generating the envelope signal comprises:

transforming the digital input signal from a complex signal to a real signal, the envelope artificial neural network configured to receive the real signal; and delaying and partitioning a signal provided by the envelope artificial neural network.

16. The method of claim 14, wherein the envelope artificial neural network receives a sensor input signal from a sensor.

17. The method of claim 14, further comprising performing Volterra processing on the digital input signal, wherein the combining comprises combining output signals of the Volterra processing with the output signals generated by the multiplying.

18. A wireless communication system comprising:

a transceiver integrated circuit comprising a digital predistortion system, the digital predistortion system comprising:

an envelope processing path configured to derive an envelope of an input signal and apply a non-linear gain function, the envelope processing path comprising an envelope artificial neural network;

multipliers configured to multiply output signals of the envelope processing path and output signals of another processing path; and a combiner configured to generate a combined output signal based on at least output signals of the multipliers and output the combined output signal, the combined output signal being a digitally predistorted version of the input signal; and a power amplifier in communication with the transceiver integrated circuit, the digital predistortion system configured to reduce non-linearity of the power amplifier.

19. The wireless communication system of claim 18, wherein the transceiver integrated circuit further comprises a sensor having an output connected to an input of the envelope artificial neural network.

20. The wireless communication system of claim 18, wherein:

a digital predistortion actuator of the transceiver integrated circuit comprises the envelope processing path, the multipliers, and the combiner; and the transceiver integrated circuit further comprises a digital predistortion adaptation circuit in communication with the digital predistortion actuator.

* * * * *